US006753123B2

(12) United States Patent
Okamura et al.

(10) Patent No.: US 6,753,123 B2
(45) Date of Patent: Jun. 22, 2004

(54) PROCESS AND APPARATUS FOR MANUFACTURING ELECTROPHOTOGRAPHIC PHOTOSENSITIVE MEMBER

(75) Inventors: Ryuji Okamura, Shizuoka (JP); Junichiro Hashizume, Shizuoka (JP); Kazuto Hosoi, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 10/180,049

(22) Filed: Jun. 27, 2002

(65) Prior Publication Data

US 2003/0124449 A1 Jul. 3, 2003

(30) Foreign Application Priority Data

Jun. 28, 2001 (JP) ....................................... 2001-196605
Jun. 20, 2002 (JP) ....................................... 2002-179621

(51) Int. Cl.[7] ......................... G03G 5/082; C23C 16/24

(52) U.S. Cl. .................. 430/128; 118/719; 118/723 IR; 427/574

(58) Field of Search .......................... 430/128; 118/719, 118/723 IR, 723 E, 723 MP, 723 MW; 427/574, 248.1, 249.1, 249.7

(56) References Cited

U.S. PATENT DOCUMENTS 4,897,281 A 1/1990 Arai et al. ................. 427/45.1
4,954,397 A 9/1990 Amada et al. ................ 430/58
4,957,772 A 9/1990 Saitoh et al. ................. 427/39
5,061,511 A 10/1991 Saitoh et al. ................. 427/38
5,273,851 A 12/1993 Takei et al. .................... 430/66
5,284,730 A 2/1994 Takei et al. .................... 430/66
5,314,780 A 5/1994 Takei et al. ................. 430/128
5,407,768 A * 4/1995 Akiyama et al. ............. 430/65
5,455,138 A 10/1995 Okamura et al. ........... 430/128
5,480,627 A 1/1996 Takei et al. ................. 430/127
5,582,944 A 12/1996 Yamamura et al. ........... 430/66
5,624,776 A 4/1997 Takei et al. .................... 430/56
5,670,286 A 9/1997 Takei et al. .................... 430/66
5,817,181 A 10/1998 Okamura et al. ............ 134/1.1
5,849,446 A 12/1998 Hashizume et al. .......... 430/67
5,976,745 A 11/1999 Aoki et al. ................... 430/66
6,001,521 A 12/1999 Hashizume et al. ....... 430/58.1
6,148,763 A * 11/2000 Akiyama et al. ........ 118/723 E
6,183,930 B1 * 2/2001 Ueda et al. ................. 430/125
6,238,832 B1 * 5/2001 Hashizume et al. .......... 430/67
6,322,943 B1 11/2001 Aoki et al. ................... 430/66
6,406,824 B1 * 6/2002 Okamura et al. ............. 430/67
2002/0038632 A1 * 4/2002 Shirasuna et al. ........ 118/723 I
2002/0150831 A1 10/2002 Ehara et al. ................ 430/126
2002/0168859 A1 11/2002 Ehara et al. ................ 438/694

FOREIGN PATENT DOCUMENTS

JP 64-86149 3/1989
JP 11-133640 5/1999
JP 11-133641 5/1999

* cited by examiner

*Primary Examiner*—John L. Goodrow
(74) *Attorney, Agent, or Firm*—Fitzpatrick, Cella, Harper & Scinto

(57) ABSTRACT

A process for manufacturing an electrophotographic photosensitive member is disclosed in which a source gas is decomposed by the use of a high-frequency power in a rector to deposit sequentially on a conductive substrate i) a photoconductive layer comprised of an amorphous material composed chiefly of silicon atoms and ii) a surface layer comprised of an amorphous material composed chiefly of carbon atoms and containing hydrogen atoms. The process has the steps of forming the photoconductive layer in a first reactor, and forming the surface layer in a second reactor. This process can produce an electrophotographic photosensitive member having an a-Si photoconductive layer and a-C:H surface layer or a-C:H(Si) surface layer in a good efficiency and at a low cost. Also disclosed is an electrophotographic photosensitive member manufacturing apparatus which carries out the process.

21 Claims, 8 Drawing Sheets

PROCESS AND APPARATUS FOR MANUFACTURING ELECTROPHOTOGRAPHIC PHOTOSENSITIVE MEMBER

BACKGROUND OF THE INVENTION

1. Field of the Invention

This invention relates to a process, and an apparatus, for manufacturing an electrophotographic photosensitive member having on a conductive substrate a photoconductive layer comprised of amorphous silicon (hereinafter "a-Si") and a surface layer comprised of amorphous carbon which contains hydrogen (hereinafter "a-C:H").

2. Related Background Art

In electrophotographic apparatus such as copying machines, facsimile machines and printers, a copy is taken in the following way: Using a photosensitive member comprising a conductive substrate and formed thereon a photoconductive layer comprised of a-Si, the surface of the photosensitive member is uniformly electrostatically charged by corona charging, roller charging, fur brush charging or magnetic-brush charging, and then exposed to light reflecting from an image to be copied (original) or laser light or LED light corresponding to modulated signals of that image, to form an electrostatic latent image on the surface of the photosensitive member. Then, a toner having been charged to a polarity opposite to that of the latent image is made to adhere to the latent image to perform development to form a toner image, and this toner image is transferred to a copying paper or the like.

In such electrophotographic apparatus, the toner remains partly on the surface of the photosensitive member, and hence such residual toner must be removed. The residual toner is commonly removed through a cleaning step making use of a cleaning blade, a fur brush or a magnet brush.

In electrophotographic apparatus available in recent years, toners having a smaller average particle diameter and a lower melting point than ever have come to be used in order to achieve higher image quality of printed images and achieve energy saving. In particular, with advancement of digitization of electrophotographic apparatus, the demand on image quality is more and more leveled up, so that even image defects having ever been tolerable have come to be deemed questionable.

The cause of the occurrence of melt adhesion or filming (of toner) which may cause such image defects has not been elucidated in detail, but its occurrence is roughly estimated in the following way.

In the cleaning step, for example, any frictional force acting between the photosensitive member and the part rubbing against it (rubbing part) may cause a phenomenon of chattering at the part of contact, where the effect of compression against the photosensitive member surface may become higher, so that the residual toner may strongly be pressed against the photosensitive member surface to cause the melt adhesion or filming. In addition, with an increase in process speed for the image formation of electrophotographic apparatus, the relative speed between the rubbing part and the photosensitive member increases, and hence this tends to more cause the melt adhesion or filming.

As countermeasures for solveing the above problem, a method is effective in which, as disclosed in, e.g., Japanese Patent Applications Laid-open No. 11-133640 and No. 11-133641 (which correspond to U.S. Pat. No. 6,001,521), a layer of non-single-crystal carbon containing hydrogen is formed as a surface layer of a photosensitive member.

The a-C:H, as it is also called diamond-like carbon (DLC), has a very high hardness. Hence, it is tough to scratches and wear and has a peculiar solid lubricity, and hence it is considered to be an optimum material for preventing the melt adhesion or filming. In fact, it has been ascertained that, where an a-C:H film is formed on the surface of a photosensitive member, the melt adhesion or filming can effectively be prevented in various environments.

However, an electrophotographic photosensitive member having this a-C:H film at the surface is manufactured using a high-frequency plasma-assisted CVD system, there have been the following problems.

Usually, when, the high-frequency plasma-assisted CVD system is used, after the step of depositing the a-C:H, any by-product (polysilane) produced during the formation of photoconductive layers must be removed by dry etching or the like to clean the interior of a reactor.

However, the cleaning performed after the successive formation from the photoconductive layer up to the surface layer (a-C:H) may inevitably take a longer time than the cleaning performed after the successive formation from the photoconductive layer up to any conventional surface layer (e.g., a-SiC).

This is due to the fact that not only the by-product (polysilane) produced during the formation of photoconductive layers but also the a-C:H film remain in the reactor. The a-C:H film has properties of being etched with great difficulty, and hence a long cleaning time is taken to remove the a-C:H film. This has been a factor of increase in manufacturing cost.

As another problem, a-C:H film pieces may slightly remain in the reactor, and hence, where the next photosensitive member is formed using the same reactor, the a-C:H film pieces having slightly remained in the cleaning step may adhere to the substrate surface when the next deposited film is formed. This has been a factor of causing image defects.

Also in the case of a surface layer comprised of a-C:H with silicon added in a very small quantity (hereinafter "a-C:H(Si)"), the layer can be etched with difficulty like the a-C:H surface layer to cause the like problem.

SUMMARY OF THE INVENTION

The present invention has been made in order to solve such problems the related background art has had. Accordingly, an object of the present invention is to provide a process, and an apparatus, for manufacturing electrophotographic photosensitive members by which an electrophotographic photosensitive member having a photoconductive layer comprised of a-Si and a surface layer comprised of a-C:H or a-C:H(Si) can be manufactured in a good efficiency and at a low cost.

Stated specifically, the present invention provides a process for producing an electrophotographic photosensitive member having at least a first layer, a second layer and a conductive substrate, comprising the steps of forming said first layer in a first reactor having been evacuated, and forming said second layer in a second reactor having been evacuated, wherein a source gas is decomposed by the use of a high-frequency power in each of said first reactor and said second reactor to deposit said first layer and said second layer on said conductive substrate, said first layer comprises an amorphous material composed chiefly of silicon atoms; and said second layer comprises an amorphous material composed chiefly of carbon atoms and contains hydrogen atoms.

The present invention also provides an apparatus for producing an electrophotographic photosensitive member having at least a first layer, a second layer and a conductive substrate, comprising at least a first reactor for forming said first layer and a second reactor for forming said second layer, wherein a source gas is decomposed by the use of a high-frequency power in each of said first reactor and said second reactor to deposit said first layer and said second layer on said conductive substrate, said first layer comprises an amorphous material composed chiefly of silicon atoms; and said second layer comprises an amorphous material composed chiefly of carbon atoms and contains hydrogen atoms.

DETAILED DESCRIPTION OF THE INVENTION

Figure 1:
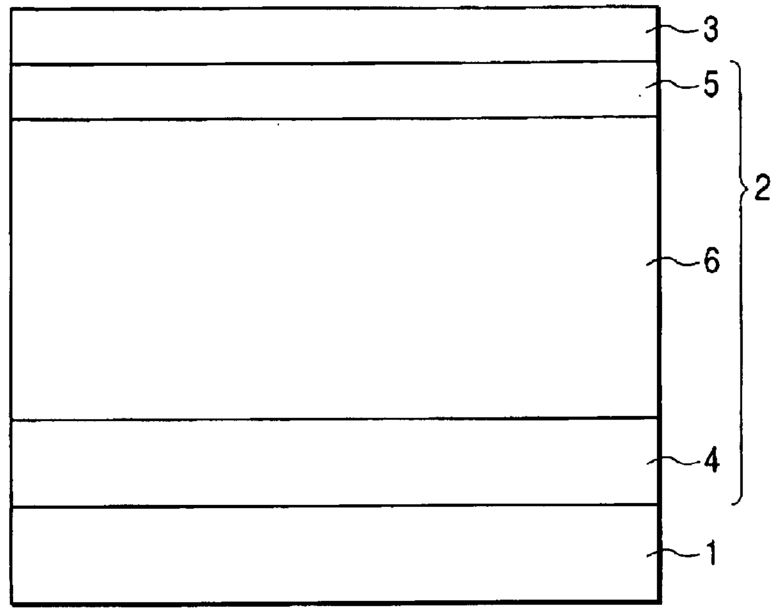
FIG. 1 is a sectional side elevation showing an example of the layer construction of an electrophotographic photosensitive member formed by the manufacturing process of the present invention.

As a result of extensive studies made in order to solve the above problems, the present inventors have discovered that a photosensitive member which can prevent image defects and toner melt adhesion over a long period of time and can maintain good image formation can be manufactured at a low cost and stably by manufacturing in the following way an electrophotographic photosensitive member at least the outermost surface of which is comprised of an amorphous carbon film, thus they have accomplished the present invention.

More specifically, in the electrophotographic photosensitive member manufacturing process of the present invention, which is a process for manufacturing an electrophotographic photosensitive member by decomposing a source gas by the use of a high-frequency power in a rector having been evacuated, to deposit on a conductive substrate in this order a photoconductive layer comprised of an amorphous material composed chiefly of silicon atoms and a surface layer comprised of an amorphous material composed chiefly of carbon atoms and containing hydrogen atoms, the process is characterized by forming the photoconductive layer in a first reactor and forming the surface layer in a second reactor.

Particulars of how they have reached the present invention are described below.

The present inventors have been on studies of a-Si photosensitive members making use of a-C:H or a-C:H(Si) in the surface layer, during which they have become aware of the fact that the treatment of dry etching in the reactor after a photosensitive member has been formed takes a longer time than ever as stated previously.

To solve this problem, it has been possible to shorten the time to a certain extent by, e.g., changing etching conditions such as the concentration and types of ethcing gases and the electric power to be applied, but any methods satisfactorily advantageous for cost have not been found.

Accordingly, the present inventors have had an idea of the step of not forming layers from the a-Si photoconductive layer up to the a-C:H surface layer or a-C:H(Si) surface layer in the same reactor, but forming layers up to the a-Si photoconductive layer in a first reactor and, after moving to a second reactor, forming the a-C:H surface layer or a-C:H (Si) surface layer therein.

The interior of the first reactor in which layers up to the photoconductive layer are formed is cleaned by dry etching after the substrate with films formed has been taken out. Since only silicon type by-products remain in the first reactor, the treatment time for dry etching can greatly be shortened. Meanwhile, on the substrate on which the layers up to the photoconductive layer have been formed, having been moved to the second reactor, only the a-C:H surface layer or a-C:H(Si) surface layer is formed in the second reactor.

In the course of forming the a-C:H surface layer, any silicon type source gas is not used, and hence any polysilane is not produced during its formation. In addition, the a-C:H surface layer can be formed in good adherence, and any contamination due to film peeling or the like in the reactor can be at a very low degree. Hence, it is unnecessary to clean the interior of the second reactor every time, and the second reactor can be used in certain cycles without any cleaning step.

In the case of the a-C:H(Si) surface layer, too, like the a-C:H surface layer, the polysilane is little produced and also the layer can likewise be formed in good adherence. Hence, it is unnecessary to clean the interior of the second reactor every time.

Where an intermediate layer is formed in the second reactor, a deposited film of the intermediate layer is very thinner than usual photoconductive layers and formed in good adherence. Hence, it is unnecessary to clean the interior of the second reactor every time.

Thus, it has been found that the manufacturing apparatus can be improved in operating efficiency and the manufacturing cost can be cut down.

In addition, the time taken to form the surface layer is very shorter than the time taken to form the photoconductive layer, and hence it is possible to employ the construction that a second reactor for forming one surface layer is provided for a plurality of first reactors for forming photoconductive layers.

In such a case, substrates on which photoconductive layers have been formed in a plurality of first reactors may be moved to the second reactor, where the a-C:H surface layer or a-C:H(Si) surface layer may successively be formed on each of them. This can save manufacturing steps and reduce the number of second reactors to bring about an improvement in investment efficiency.

Moreover, comparing the cleaning time in a reactor between a case in which layers from the photoconductive layer up to the a-C:H surface layer or a-C:H(Si) surface layer are formed in the same reactor and a case in which only the photoconductive layer is formed in a reactor, it was found that there is a difference in the state of cleaning, in addition to the above effect of shortening the treatment time for dry etching.

As stated above, the a-C:H surface layer and the a-C:H (Si) surface layer are difficult to etch, and surface layer film pieces may remain even after cleaning where the photoconductive layer and the a-C:H surface layer or a-C:H(Si) surface layer are formed in the same reactor, so that contaminate the interior of the reactor may be contaminated with repetition of manufacturing cycles to cause image defects ascribable to the electrophotographic photosensitive member.

On the other hand, in the manufacturing process of the present invention, the interior of the first reactor is kept to stand very clean after the dry etching, and the image defects can be made to occur at a very low probability, bringing about reduction in a rejection rate. Also, the formation of the a-C:H surface layer or a-C:H(Si) surface layer in the second reactor brings about the following secondary advantage.

It is known that sufficient high-frequency energy is necessary in order to form a good-quality a-C:H surface layer or a-C:H(Si) surface layer on the surface of the photosensitive member as stated above. This is because the deposited layer may come polymeric to have no sufficient hardness unless sufficient energy is applied to the flow rate of a hydrocarbon gas as a source gas. For this reason, as conditions for forming the a-C:H surface layer or a-C:H(Si) surface layer, a greater high-frequency power must be applied, compared with conditions for forming a-Si layers. In particular, the a-C:H layer is susceptible to conditions for generating plasma to tend to cause uneven hardness and layer thickness distribution. However, a reactor set to conditions optimum for the formation of a-C:H layers was found to be not necessarily optimum for the formation of a-Si layers.

In the case where the reactor for forming the photoconductive layer and another reactor for forming the a-C:H surface layer or a-C:H(Si) surface layer are used as in the present invention, the reactors can be used in optimum form for the formation of the respective layers. Hence, deposited films having higher performance and function for each layer can be designed with ease, and electrophotographic photosensitive members having much higher performance can be obtained.

The present invention is described below in detail with reference to the accompanying drawings.

The construction of an electrophotographic photosensitive member to be manufactured by the process of the present invention is described first.

FIG. 1 is a sectional side elevation showing an example of the layer construction of an electrophotographic photosensitive member formed by the manufacturing process of the present invention.

As shown FIG. 1, the electrophotographic photosensitive member has structure that a photosensitive layer 2 (having a photoconductive layer 6) and a surface layer are superposed sequentially on a cylindrical substrate made of a conductive material as exemplified by aluminum (Al) and stainless steel. In the present invention, a-Si is used as a material of the photosensitive layer 2 and the a-C:H or a-C:H(Si) is used as a material of the surface layer 3. Also, the photosensitive layer 2 may optionally be provided with layers having various functions, such as a lower-part blocking layer 4 and an intermediate layer 5, in addition to the photoconductive layer 6.

As the cylindrical substrate 1, the above one made of a conductive material such as aluminum and stainless steel is commonly used. Also usable are substrates having no conductivity such as various plastics and ceramics on which a conductive material has been vacuum-deposited to endow them with conductivity.

First Embodiment

Figure 2:
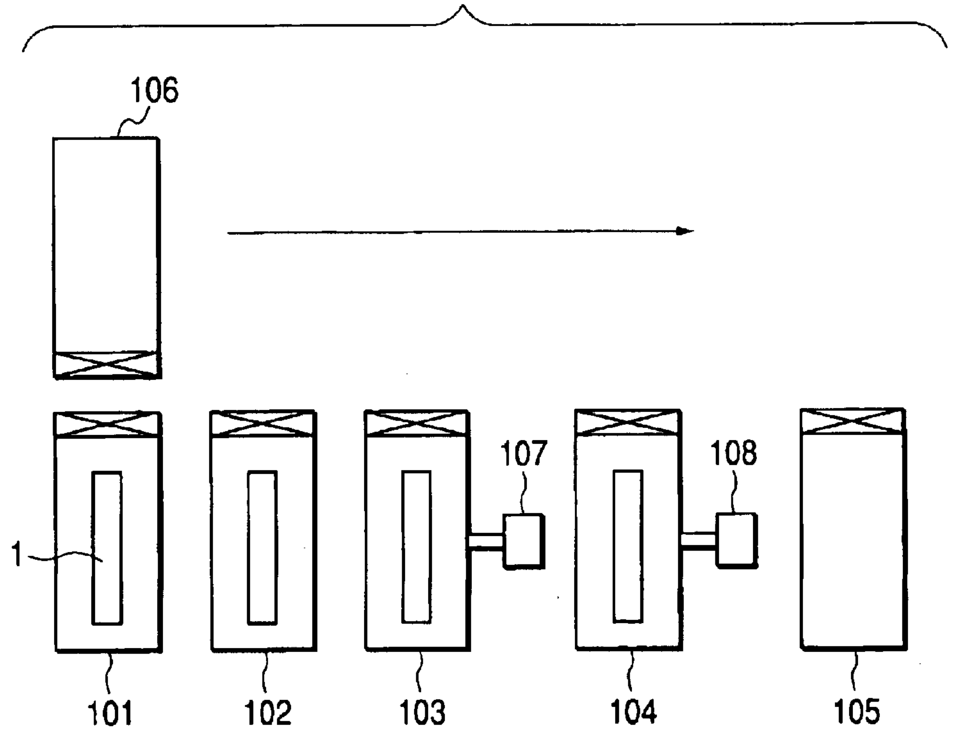
FIG. 2 is a block diagram showing the construction of a first embodiment of the electrophotographic photosensitive member manufacturing apparatus of the present invention.
Figure 3:
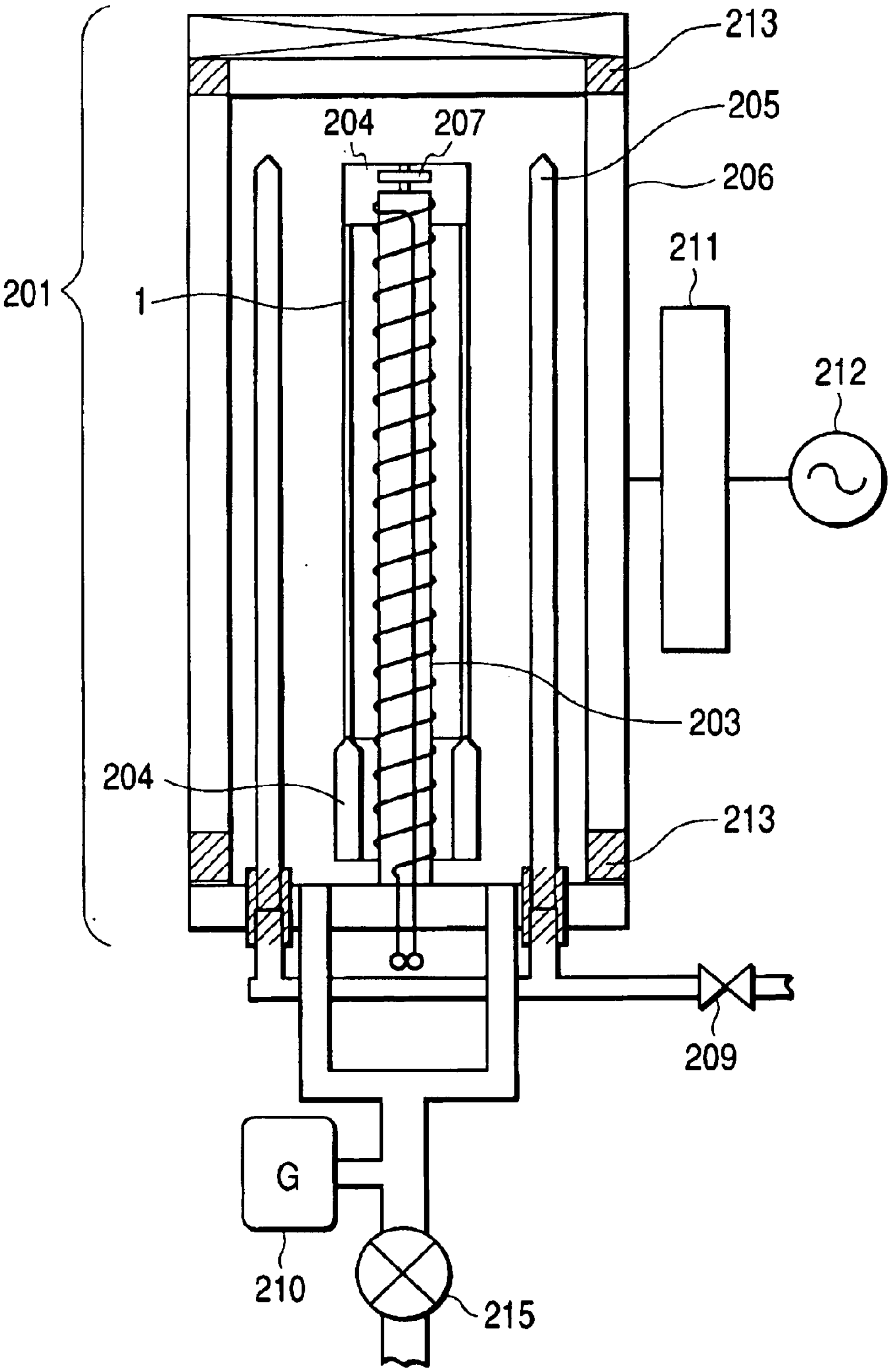
FIG. 3 is a diagrammatic view showing an example of the construction of the fist reactor and second reactor of the manufacturing apparatus shown in FIG. 2.

FIG. 2 is a block diagram showing the construction of a first embodiment of the electrophotographic photosensitive member manufacturing apparatus of the present invention. FIG. 3 is a diagrammatic view showing an example of the construction of the fist reactor and second reactor of the manufacturing apparatus shown in FIG. 2.

As shown in FIG. 2, the electrophotographic photosensitive member manufacturing apparatus according to this Embodiment is constructed to have a loading container 101 for loading in the manufacturing apparatus the cylindrical substrate 1 made of a conductive material, a heating container 102 for heating the cylindrical substrate 1 to a preset temperature, a first reactor 103 for forming a photoconductive layer on the cylindrical substrate 1, a second reactor 104 for forming a surface layer on the photoconductive layer formed in the first reactor 103, an unloading container 105 for unloading from the manufacturing apparatus the cylindrical substrate 1 on which the photoconductive layer and the surface layer have respectively been formed, and a vacuum transport container 106 for transporting the cylindrical substrate 1 loaded into the loading container 101 to each of the heating container 102, the first reactor 103, the second reactor 104 and the unloading container 105 in this order. Also, to the first reactor 103, a first high-frequency power source 107 for supplying high-frequency power into the first reactor 103 is connected. To the second reactor 104, a second high-frequency power source 108 for supplying high-frequency power into the second reactor 104 is connected.

With such construction, a procedure of manufacturing the electrophotographic photosensitive member according to this Embodiment is described below with reference to FIG. 2.

Load a cylindrical substrate 1 the surface of which has been worked by cutting and cleaned, into the loading container 101 to introduce it into the manufacturing apparatus.

Evacuate the interior of the loading container 101 into which the cylindrical substrate 1 has been loaded, and transport the cylindrical substrate 1 from the loading container 101 to the heating container 102 by mean of the vacuum transport container 106.

Heat to a desired temperature the cylindrical substrate 1 transported to the heating container 102, and then transport the heated substrate to the first reactor 103 by means of the vacuum transport container 106.

Feed source gases necessary for forming the photoconductive layer 6, from a source gas feed system (not shown) into the first reactor 103 in which the cylindrical substrate 1 has been placed, and simultaneously supply an electric power from the first high-frequency power source 107 to form the photoconductive layer 6 on the surface of the cylindrical substrate 1.

Transport the cylindrical substrate 1 on which the photoconductive layer 6 has been formed, to the second reactor 104 by means of the vacuum transport container 106.

Feed a hydrocarbon source gas and optionally a dilute gas from a source gas feed system (not shown) into the second reactor 104 in which the cylindrical substrate 1 on which the photoconductive layer 6 has been formed has been placed, and simultaneously supply an electric power from the second high-frequency power source 108 to form a a-C:H or a-C:H(Si) surface layer 3 on the photoconductive layer 6 on the surface of the cylindrical substrate 1, to make up a photosensitive member.

Having completed the formation of the surface layer 3, transport the photosensitive member into the unloading container 105 by means of the vacuum transport container 106. After purging its interior sufficiently with a gas such as argon or nitrogen, unload the photosensitive member to the outside of the manufacturing apparatus.

After transporting the cylindrical substrate 1 on which the photoconductive layer 6 has been formed, from the first reactor 103 to the second reactor 104, clean the interior of the first reactor 103 by dry etching to remove polysilane secondarily produced at the time of forming the photoconductive layer 6.

The dry etching is carried out by supplying an electric power from the high-frequency power source 107 in such a state that an etching gas such as $CF_4$ or $ClF_3$ and a dilute gas have been fed into the first reactor 103 from a dry-etching gas feed system (not shown). The dry etching of the first reactor 103 may be carried out simultaneously with the formation of the surface layer in the second reactor 104.

On completion of the cleaning of the interior of the first reactor 103, transport thereinto a next cylindrical substrate 1 kept being heated and standing by in the heating container 102, to form the photoconductive layer 6 on the surface of the cylindrical substrate 1.

The above steps may be repeated to manufacture electrophotographic photosensitive members.

The first reactor 103 and second reactor 104 shown in FIG. 2 are described in detail with reference to FIG. 3.

As shown in FIG. 3, the first reactor 103 and the second reactor 104 are each a plasma-assisted CVD system which decomposes source gases by the aid of high-frequency power and is constructed to have a deposition unit having a reactor 201 and have a vacuum system (not shown) for evacuating the interior of the reactor 201.

The reactor 201 is provided therein with a conductive bearing 207 connected to the ground (ground potential). A cylindrical substrate 1 having been transported into the reactor 201 is disposed on the conductive bearing 207. The reactor 201 is also provided therein with a heater 203 for heating the cylindrical substrate 1 and gas feed pipes 205 through which the source gas is fed into the reactor. To the gas feed pipes 205, a source gas feed system (not shown) is connected via a valve 209.

To the reactor 201, an exhaust means 215 for exhausting the internal gases is connected, and a vacuum gage 210 is attached to a pipe extending from the reactor 201 to the exhaust means 215.

On the outside of the reactor 201, a high-frequency power source 212 for supplying high-frequency power is provided, and the high-frequency power source 212 is connected to a cathode electrode 206 made of a conductive material through a matching box 211. Also, the cathode electrode 206 is kept insulated from the reactor 201 by insulating materials 213.

With such construction, the cylindrical substrate 1, the surface of which has been subjected to mirror finish by means of, e.g., a lathe, is attached to auxiliary substrates 204, and is first transported into the first reactor 103, comprising the reactor 201, via the loading container 101 and the heating container 102. Here, the cylindrical substrate 1 is so placed as to enclose the substrate-heating heater 203.

After the cylindrical substrate 1 has been placed in the reactor 201, the valve 209 for feeding source gases is closed, and the exhaust system (not shown) is operated to draw out the internal gas through the exhaust means 215, and then the valve is opened to feed an inert gas for heating, e.g., argon gas, into the reactor 201 through the gas feed pipes 205. Here, the exhaust rate of the exhaust system and the flow rate of the heating gas are so regulated that the reactor 201 comes to have the desired internal pressure.

Thereafter, a temperature controller (not shown) is operated to heat the cylindrical substrate 1 with the substrate-heating heater 203 to control the temperature of the cylindrical substrate 1 to a preset temperature within the range of from 20° C. to 500° C.

At the time the cylindrical substrate 1 has been heated to the desired temperature, the valve 209 for feeding source gases is closed to stop the gases flowing into the reactor 201.

In such a state, when the photoconductive layer 6 is formed on the cylindrical substrate 1, the valve 209 for feeding source gases is opened to introduce a prescribed source gas such as silane gas, disilane gas, methane gas or ethane gas and a doping gas such as diborane gas or phosphine gas into a mixing panel (not shown) to mix these gases, and thereafter feed them into the reactor 201 through the gas feed pipes 205. Then, a mass flow controller (not shown) is operated to regulate the flow rate of source gases to the preset value. Having made sure that the gas pressure inside the reactor 201 has became stable, a prescribed electric power is supplied to the cathode electrode 206 from the high-frequency power source 212 via the matching box 211 to cause glow discharge to take place in the reactor 201.

By this glow discharge energy, the source gases fed into the reactor 201 are decomposed, and the desired photoconductive layer 6 is formed on the surface of the cylindrical substrate 1.

After the photoconductive layer 6 has been formed on the cylindrical substrate 1 in a desired thickness, the supply of high-frequency power and the feeding of source gases into the reactor 201 are stopped. The interior of the reactor 201 is evacuated to a high vacuum and then the formation of the photoconductive layer is finished.

Using different corresponding source gases and film-forming conditions, the above steps may basically be repeated to form the lower-part blocking layer 4 or the intermediate layer 5.

The cylindrical substrate 1 on which the layers up to the photoconductive layer 6 or the intermediate layer 5 have been formed is moved to the second reactor 104 by means of the vacuum transport container 106, and the a-C:H surface layer or a-C:H(Si) surface layer 3 is formed in the second reactor 104.

The second reactor 104 also has the same construction as the first reactor 103 shown in FIG. 3. Source gases necessary for forming the a-C:H surface layer or a-C:H(Si) surface layer are selected and are fed from the gas feed system.

In the case where the a-C:H surface layer is formed, used as source gases are, e.g., $CH_4$, $C_2H_2$, $C_2H_4$, $C_2H_6$, $C_3H_8$ and $C_4H_{10}$, any of which is mixed with a diluted gas such as hydrogen or helium, which are then fed into the reactor 201 through the gas feed pipes 205 via the valve 209 at preset flow rates.

In the present invention, the surface layer 3 is preferably usable also when it contains silicon atoms. Incorporation of silicon atoms can make optical band gaps broader, and is preferable in view of sensitivity. Too many silicon atoms, however, may lower resistance to melt adhesion or filming, and hence their content must be determined balancing the band gap. The relationship between this silicon atom content and the melt adhesion or filming is known to be influenced also by the substrate temperature at the time of film formation. More specifically, in the case of the a-C:H surface layer in which silicon are incorporated, the resistance to melt adhesion or filming can be improved when the substrate temperature is a little lower. Accordingly, in the case when the a-C:H surface layer in which silicon atoms are incorporated is used as the surface layer in the present invention, the substrate temperature may preferably be determined within the range from 20° C. to 150° C., and preferably at about room temperature.

The content of the silicon atoms used in the present invention may appropriately be changed depending on various manufacturing conditions, substrate temperature, source gas species and so forth. Typically, it may preferably be in the range of $0.2\% \leqq \{Si/(Si+C)\} \times 100 < 10\%$, and more preferably $0.2\% \leqq \{Si/(Si+C)\} \times 100 < 5\%$, as the ratio of silicon atoms to the sum of silicon atoms and carbon atoms.

In the case where the a-C:H surface layer is formed, source gases may include, in addition to the above carbon type source gases and dilute gases, as those effectively usable, materials that can serve as source gases for feeding silicon atoms as exemplified by gaseous or gasifiable silicon hydrides (silanes) such as $SiH_4$, $Si_2H_6$, $Si_3H_8$ and $Si_4H_{10}$. In view of easiness of handling at the time of film formation and Si-feeding efficiency, $SiH_4$ and $Si_2H_6$ are preferred.

The surface layer 3 is formed in the same manner as the formation of the above photoconductive layer 6 except that different source gases are fed under different conditions. In addition, this Embodiment is also effective when a fluorine (F)—containing amorphous carbon (a-C-:F) layer is formed as the surface layer 3. In such a case, it may be formed according to the same procedure as the above except that materials containing fluorine atoms are used as the source gases.

Second Embodiment

Figure 4:
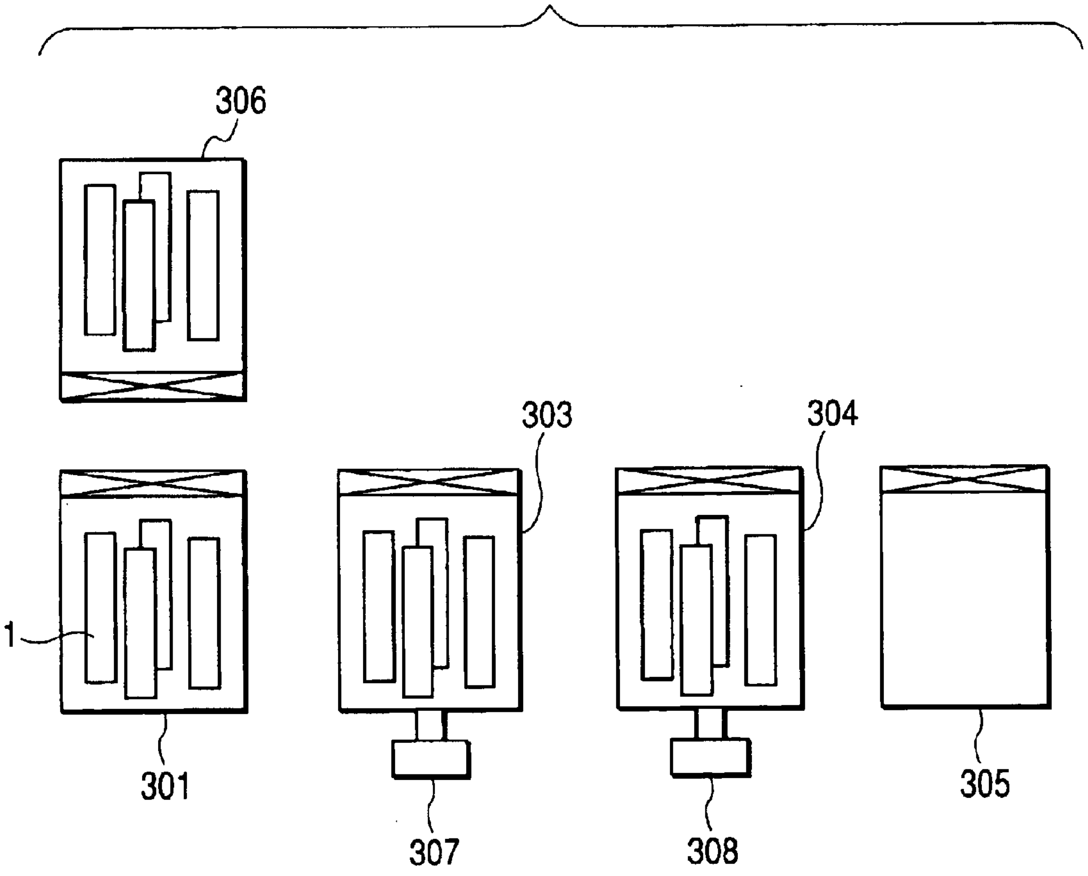
FIG. 4 is a block diagram showing the construction of a second embodiment of the electrophotographic photosensitive member manufacturing apparatus of the present invention.
Figure 5:
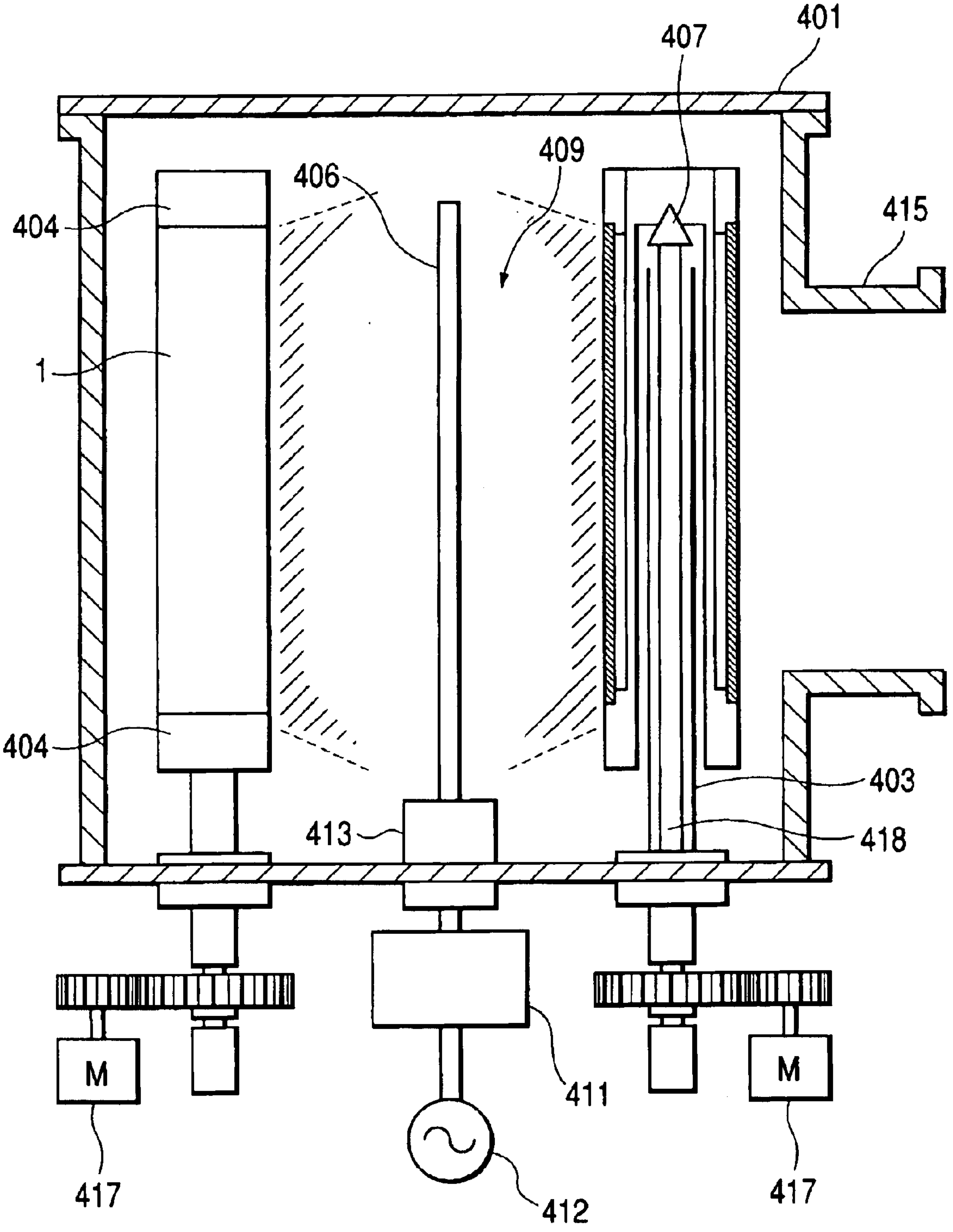
FIG. 5 is a diagrammatic view showing an example of the construction of the fist reactor and second reactor of the manufacturing apparatus shown in FIG. 4.

FIG. 4 is a block diagram showing the construction of a second embodiment of the electrophotographic photosensitive member manufacturing apparatus of the present invention. FIG. 5 is a diagrammatic view showing an example of the construction of the fist reactor and second reactor of the manufacturing apparatus shown in FIG. 4.

As shown in FIG. 4, the electrophotographic photosensitive member manufacturing apparatus according to the second Embodiment is constructed to have a loading container 301 for loading in the manufacturing apparatus the cylindrical substrate 1, a first reactor 303 for forming therein a photoconductive layer on the cylindrical substrate 1, a second reactor 304 for forming a surface layer on the photoconductive layer formed in the first reactor 303, an unloading container 305 for unloading from the manufacturing apparatus the cylindrical substrate 1 on which the photoconductive layer and the surface layer have respectively been formed, and a vacuum transport container 306 for transporting the cylindrical substrate 1 loaded into the loading container 301 to each of the first reactor 303, the second reactor 304 and the unloading container 305 in this order. Also, to the first reactor 303, a first high-frequency power source 307 for supplying high-frequency power into the first reactor 303 is connected. To the second reactor 304, a second high-frequency power source 308 for supplying high-frequency power into the second reactor 304 is connected.

The electrophotographic photosensitive member manufacturing apparatus of this Embodiment has such a construction that the loading container 301, the first reactor 303, the second reactor 304 and the vacuum transport container 306 can each process a plurality of cylindrical substrates 1 at a time. It also has such a construction that the cylindrical substrates 1 are heated with substrate-heating heaters provided respectively in the first reactor 303 and the second reactor 304, i.e., a construction which makes it unnecessary to provide the heating container 302 (see FIG. 2) used in First Embodiment.

As shown in FIG. 5, the first reactor 303 and second reactor 304 of this Embodiment are each, like that in First Embodiment, a plasma-assisted CVD system which decomposes source gases by the aid of high-frequency power and is constructed to have a deposition unit having a reactor 401 and have a vacuum system (not shown) for evacuating the interior of the reactor 401.

The reactor 401 in this Embodiment is also so constructed that a plurality of cylindrical substrates 1 are placed in a concentric circle around a cathode electrode 406, and a discharge space 419 is formed at the space surrounded by them. Such a construction enables a plurality of photosensitive members to be formed at the same time.

As shown in FIG. 5, the reactor 401 is provided therein with a plurality of rotating shafts 418. The rotating shafts 418 are respectively provided with conductive bearings 407 as a placement mechanism for the cylindrical substrates 1. The cylindrical substrates 1 are each attached to auxiliary substrates 404, and are transported into the first reactor 303, comprising the reactor 401, via the loading container 301. Thereafter, they are respectively disposed on the conductive bearings 407. Also, substrate-heating heaters 403 for heating the cylindrical substrates 1 are respectively provided on the peripheries of the rotating shafts 418.

To the rotating shafts 418, rotating motors 417 for rotating the cylindrical substrates 1 are respectively attached, by means of which the cylindrical substrates 1 placed in the reactor 401 are respectively rotated so that deposited layers can be formed on the whole peripheries of the cylindrical substrates 1.

On the outside of the reactor 401, a high-frequency power source 412 for supplying high-frequency power is provided, and the high-frequency power source 412 is connected to the cathode electrode 406 made of a conductive material, through a matching box 411. Also, the cathode electrode 406 is kept insulated from the reactor 401 by an insulating material 413.

The reactor 401 is provided with a gas feed pipe (not shown) for feeding source gases from a source gas feed system (not shown). An exhaust system (not shown) for exhausting the internal gases is further connected to the reactor 401 via an exhaust vent.

In addition, the high-frequency power source 412 which supplies high-frequency power into the reactor in this Embodiment may be a power source which can change frequencies to any desired values.

In the manufacturing apparatus of this Embodiment, too, the cylindrical substrates 1 are maintained at preset temperature by means of the substrate-heating heaters 403 in the same way as in the reactor in First Embodiment, and deposited layers are respectively formed according to the same procedure as that in First Embodiment.

Third Embodiment

In First and Second Embodiments described above, the second reactor is effective even when it has the same construction as the first reactor. It is more effective to improved the second reactor to have a construction which is optimum for forming the a-C:H or a-C:H(Si) surface layer 3.

More specifically, the first reactor for forming the photoconductive layer 6 and the second reactor for forming the surface layer 3 may preferably be set up to have optimum construction for each reactor by changing, e.g., the construction of power supply systems and gas feed pipes, that of exhaust systems and the frequency of high-frequency power.

Figure 6:
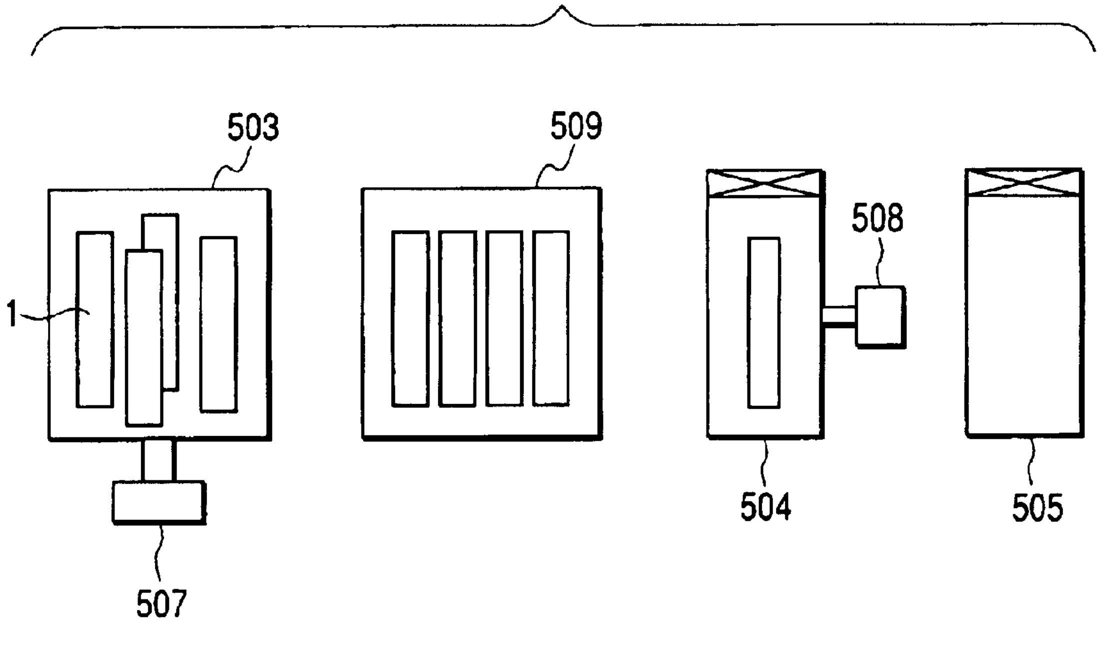
FIG. 6 is a block diagram showing the construction of a third embodiment of the electrophotographic photosensitive member manufacturing apparatus of the present invention.

FIG. 6 is a block diagram showing the construction of a third embodiment of the electrophotographic photosensitive member manufacturing apparatus of the present invention.

As shown in FIG. 6, this Embodiment has such a construction that a reactor having the same construction as that in Second Embodiment, shown in FIG. 5, is used as a first reactor 503 and a VHF power source of 80 MHz frequency is used as a first high-frequency power source 507. It also has such a construction that a reactor having the same construction as that in First Embodiment, shown in FIG. 3, is used as a second reactor 504 and a power source of 13.56 MHz frequency is used as a second high-frequency power source 508. In FIG. 6, the loading container for loading the cylindrical substrates 1 and the vacuum transport container for transporting the cylindrical substrates 1 are not illustrated. These containers are also provided in the manufacturing apparatus of this Embodiment, like those in First and Second Embodiments described above.

With such construction, on the cylindrical substrates 1 placed in the first reactor 503, photoconductive layers 6 are formed according to the same procedure as that in Second Embodiment. The cylindrical substrates on which the photoconductive layers 6 have been formed are transported to a stand-by (waiting) container 509, and then transported to the second reactor 504. In the second reactor 504, the a-C:H or a-C:H(Si) surface layer 3 is sequentially formed according to the same procedure as that in First Embodiment. After the photoconductive layers 6 and surface layers 3 have been formed, the resultant photosensitive members are transported to an unloading container 105 and, after purging, unloaded outside the manufacturing apparatus.

In this Embodiment, an example has been shown in which high-frequency power with a frequency of 80 MHz is supplied to the first reactor 503 and high-frequency power with a frequency of 13.56 MHz is supplied to the second reactor 504. Without being limited to such a construction, the device construction for forming in an optimum state the surface layer formed in the second reactor 104 and the frequencies of high-frequency power may appropriately be selected.

Fourth Embodiment

Figure 7:
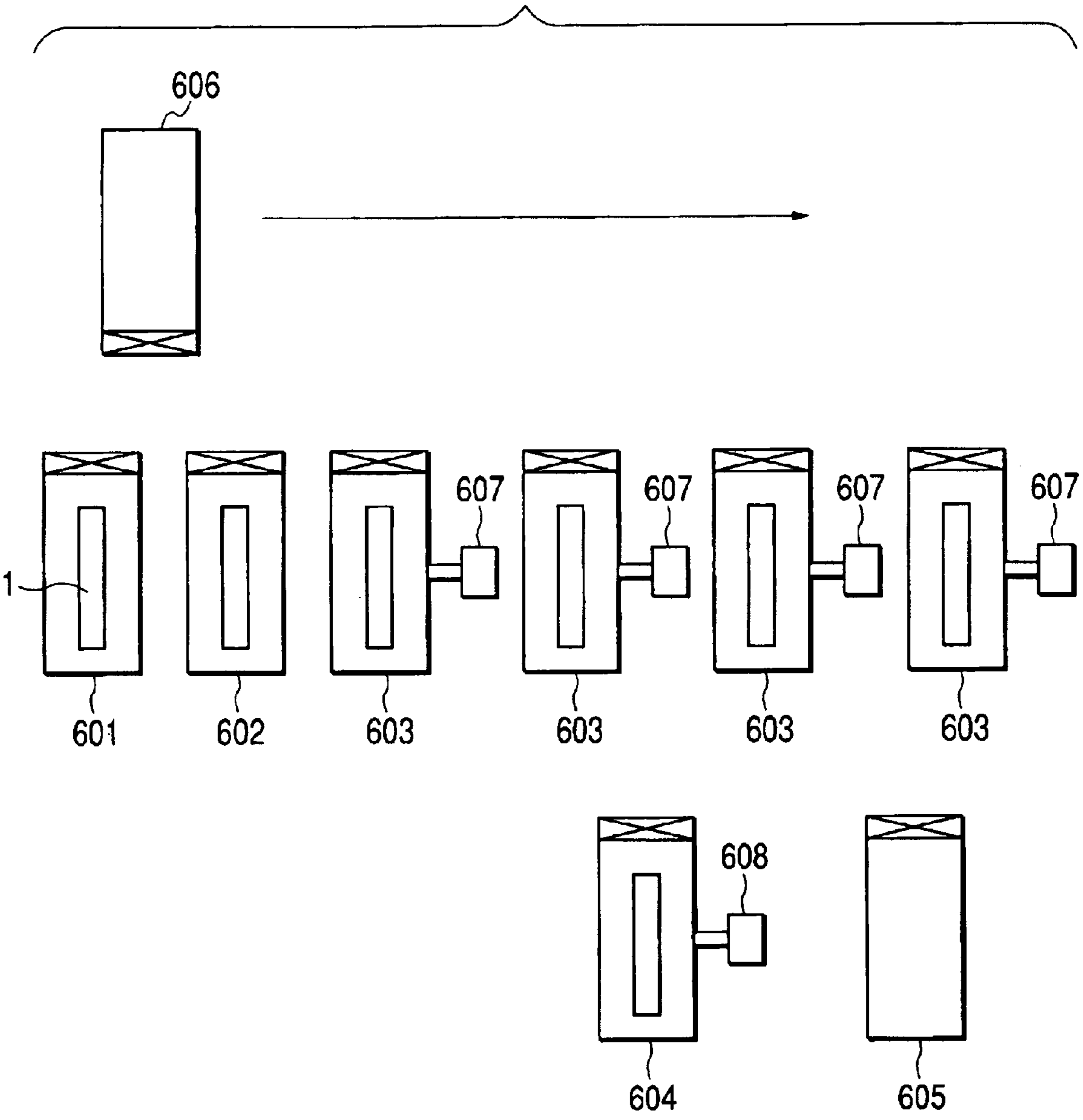
FIG. 7 is a block diagram showing the construction of a fourth embodiment of the electrophotographic photosensitive member manufacturing apparatus of the present invention.

FIG. 7 is a block diagram showing the construction of a fourth embodiment of the electrophotographic photosensitive member manufacturing apparatus of the present invention.

The electrophotographic photosensitive member manufacturing apparatus according to Fourth Embodiment is constructed to have a loading container 601 for loading in the manufacturing apparatus the cylindrical substrate 1 made of a conductive material, a heating container 602 for heating the cylindrical substrate 1 to a preset temperature, a plurality of first reactors 603 each for forming a photoconductive layer on the cylindrical substrate 1, a second reactor 604 for forming a surface layer on the photoconductive layer formed in each first reactor 603, an unloading container 605 for unloading from the manufacturing apparatus the cylindrical substrate 1 on which the photoconductive layer and the surface layer have respectively been formed, and a vacuum transport container 606 for transporting the cylindrical substrate 1 loaded into the loading container 601 to each of the heating container 602, the first reactors 603, the second reactor 604 and the unloading container 605 in this order. Also, to the first reactors 603, first high-frequency power sources 607 are respectively connected. To the second reactor 604, a second high-frequency power source 608 is connected. The vacuum transport container 606 transports the cylindrical substrate 1 to any one of vacant first reactors 603 among the plurality of first reactors 603.

With such a construction, cylindrical substrates 1 are sequentially placed in the plurality of first reactors 103 via the loading container 601 and the heating container 602, and photoconductive layers 6 are formed according to the same procedure as that in First Embodiment. Then, the cylindrical substrates on which the photoconductive layers 6 have been formed are sequentially transported to the second reactor 604, and the a-C:H surface layer or a-C:H(Si) surface layer is formed in the second reactor 604.

Such a construction enables dead time to be reduced in each reactor to efficiently manufacture electrophotographic photosensitive members and also can make the number of the second reactors 604 smaller than the number of the first reactors 603. Hence, the cost of the initial investment can greatly be reduced.

In addition, the number of each reactor may appropriately be determined in accordance with the film formation time for each layer and the production cycles. A stand-by container may also be provided as in the Third Embodiment.

In all Embodiments described above, deciding whether the first reactor or the second reactor is to be used to form the intermediate layer 5 may appropriately be selected in accordance with the relationship between time for etching the inside of the first reactor and production cycles and how the second reactor is designed.

EXAMPLES

The present invention is further described below by giving Examples, with reference to the drawings.

Example 1

In this Example, using the electrophotographic photosensitive member manufacturing apparatus shown in FIG. 2, layers up to a photoconductive layer comprised of amorphous silicon containing hydrogen (hereinafter "a-Si:H") were formed on a cylindrical substrate 1 of 108 mm in outer diameter, 358 mm in length and 3 mm in wall thickness, made of aluminum, in the first reactor 103 under conditions shown in Table 1.

TABLE 1

| | |
|---|---|
| Lower-part blocking layer: | |
| $SiH_4$ | 300 ml/min (normal) |
| $H_2$ | 600 ml/min (normal) |
| NO | 10 ml/min (normal) |
| $B_2H_6$ | 2,000 ppm (based on $SiH_4$ flow rate) |
| Power | 200 W (13.56 MHz) |
| Discharge space pressure | 80 Pa |
| Substrate temperature | 200° C. |
| Film formation time | 60 min |
| Photoconductive layer: | |
| $SiH_4$ | 450 ml/min (normal) |
| $H_2$ | 450 ml/min (normal) |
| Power | 300 W (13.56 MHz) |
| Discharge space pressure | 66.5 Pa |
| Substrate temperature | 200° C. |
| Film formation time | 240 min |

Next, the cylindrical substrate 1 on which the layers up to the photoconductive layer were formed was transported to the second reactor 104 by means of the vacuum transport container 106, where a surface layer comprised of a-C:H was formed under conditions shown in Table 2. During this process, the interior of the first reactor 103 was cleaned by dry etching under conditions shown in Table 3, which was done simultaneously with the second-layer formation in the second reactor 104.

TABLE 2

| Surface layer: | |
|---|---|
| $C_2H_2$ | 120 ml/min (normal) |
| Power | 1,000 W (13.56 MHz) |
| Internal pressure | 73 Pa |
| Substrate temperature | 150° C. |
| Film formation time | 5 min |

TABLE 3

| Etching conditions: | |
|---|---|
| $ClF_3$ | 200 ml/min (normal) |
| Ar | 400 ml/min (normal) |
| Power | 1,000 W (13.56 MHz) |
| Discharge space pressure | 80 Pa |
| Substrate temperature | 200° C. |

This cycle was repeated by ten cycles to make up ten electrophotographic photosensitive members. Here, in this Example, substrate-heating time was 30 minutes, and time for dry etching in the first reactor 103 was 120 minutes. Also, the time taken for ten cycles was 4,230 minutes.

Comparative Example 1

Figure 8:
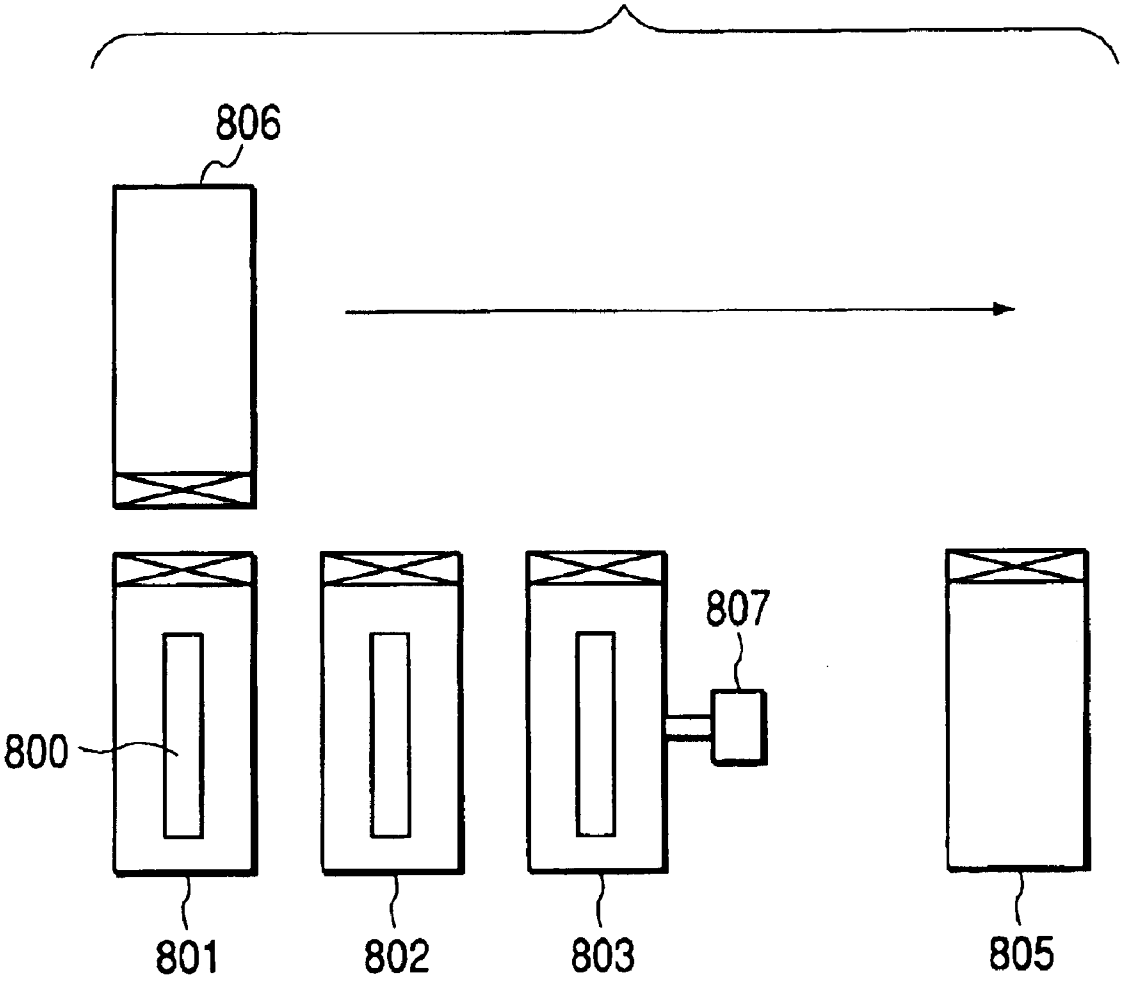
FIG. 8 is a block diagram showing the construction of an electrophotographic photosensitive member manufacturing apparatus of Comparative Example in which the photoconductive layer and the surface layer are formed in one reactor.

To compare the manufacturing process of Example 1 described above, a photosensitive member was prepared by forming the first-layer photoconductive layer and the second-layer surface layer in one reactor 401 as shown in FIG. 8.

FIG. 8 is a block diagram showing the construction of an electrophotographic photosensitive member manufacturing apparatus of Comparative Example in which the photoconductive layer and the surface layer are formed in one reactor.

As shown in FIG. 8, the electrophotographic photosensitive member manufacturing apparatus of Comparative Example is constructed to have a loading container 801 for loading in the manufacturing apparatus a cylindrical substrate 800 made of a conductive material, a heating container 802 for heating therein the cylindrical substrate 800 to a preset temperature, a reactor 803 for forming therein a photoconductive layer and a surface layer on the cylindrical substrate 800, an unloading container 805 for unloading from the manufacturing apparatus the cylindrical substrate 800 on which the photoconductive layer and the surface layer have been formed, and a vacuum transport container 806 for transporting the cylindrical substrate 800 loaded into the loading container 801, to each of the heating container 802, the reactor 803 and the unloading container 805 in this order. Also, to the reactor 803, a high-frequency power source 807 for supplying high-frequency power to the reactor 803 is connected.

In the manufacturing apparatus used in the Comparative Example, shown in FIG. 8, the photosensitive member is manufactured according to the same procedure as in Example 1 from the loading of the cylindrical substrate 800 in the loading container 801 up to its transport to the reactor 803.

On the cylindrical substrate 800 placed in the reactor 803, the photoconductive layer and the surface layer are each formed in the same reactor. The photosensitive member thus prepared is transported to the unloading container 805 and is unloaded outside the apparatus.

The interior of the reactor 803 in which the films have been formed is cleaned by dry etching to remove the polysilane secondarily produced upon the film formation. Into the reactor 803 which has been cleaned, the next cylindrical substrate 800 kept standing by in the heating container 802 is transported, and the films are again formed. Repeating the above cycle, electrophotographic photosensitive members are manufactured.

Using this electrophotographic photosensitive member manufacturing apparatus shown in FIG. 8, layers up to a photoconductive layer comprised of a-Si:H were formed on a cylindrical substrate 800 of 108 mm in outer diameter, 358 mm in length and 3 mm in wall thickness, made of aluminum, in the reactor 803 under the conditions shown in Table 1, and subsequently a surface layer comprised of a-C:H was formed under the conditions shown in Table 2. According to such a procedure, an electrophotographic photosensitive member was prepared. After the electrophotographic photosensitive member was unloaded from the apparatus, the interior of the reactor 803 was cleaned by dry etching under the conditions shown in Table 3. This cycle was repeated by ten cycles to make up ten electrophotographic photosensitive members.

In this Comparative Example, etching treatment time in the reactor 803 was 180 minutes. Also, the time taken for ten cycles was 5,120 minutes.

Next, the photosensitive members prepared in Example 1 and Comparative Example 1 were each set in an electrophotographic apparatus (a remodeled machine iR6000, manufactured by CANON INC.) to evaluate electrophotographic performance in the following way.

a) Image defects:

The electrophotographic photosensitive members thus prepared were each set in the electrophotographic apparatus. A halftone chart (FY9-9042-020, available from CANON INC.) was placed on a copy stand to take a copy, and the number of white spots 0.5 mm or more in diameter appearing within an A3-sized copied image was counted.

Results obtained are shown in Table 4. In Table 4, image defects are indicated as shown below.

AA: Only 0 to 2 white spot(s) is/are seen, and not disturbing at all.
A: 3 to 5 white spots are seen, but not disturbing.
B: 6 to 10 white spots are seen, and a little disturbing.
C: 11 or more white spots are seen, and disturbing.

TABLE 4

| | Cycle: | | | | | | | | | |
|---|---|---|---|---|---|---|---|---|---|---|
| | 1 | 2 | 3 | 4 | 5 | 6 | 7 | 8 | 9 | 10 |
| Example 1: | AA | AA | AA | AA | AA | AA | AA | AA | AA | AA |
| Comparative Example 1: | AA | AA | AA | AA | A | A | A | A | B | B |

As shown in Table 4, even when those obtained after repeated cycles were used, the photosensitive members prepared in Example 1 caused less image defects than that of Comparative Example 1 and showed good results. Also, in Example 1 the etching time was made shorter than that in Comparative Example 1, and the time for manufacturing cycle was greatly shortened to bring about improvement in manufacturing efficiency.

Example 2

In this Example, using the electrophotographic photosensitive member manufacturing apparatus shown in FIG. 7, layers up to photoconductive layers comprised of a-Si:H were formed on a cylindrical substrate 1 of 108 mm in outer diameter, 358 mm in length and 3 mm in wall thickness, made of aluminum, in the same manner as in Example 1 but in the plurality of first reactors 603, under the conditions shown in Table 1. Thereafter, the cylindrical substrates on each of which the layers up to the photoconductive layer were formed were successively moved to the second reactor 604, and the surface layer comprised of a-C:H was formed on each photoconductive layer under the conditions shown in Table 2. During this process, the interiors of the first reactors 603 were cleaned by dry etching under the conditions shown in Table 3, which was done simultaneously. Here, this Example has construction that four first reactors are provided for one second reactor.

In this Example, the time taken to form the surface layer in the second reactor was 20 minutes per one photosensitive member, inclusive of cooling time, transport time and so forth. Also, time for dry etching in each first reactor was 120 minutes like Example 1.

In the manufacturing apparatus used in this Example, the cylindrical substrates were each heated for 30 minutes in the heating container and thereafter successively transported to the first reactor, where the layers up to the photoconductive layer were formed. Then, the cylindrical substrates held in the first reactors in which the formation of photoconductive layers was completed were successively moved to the second reactor, where the surface layer was formed under the conditions shown in Table 2. Thus, the timing of finishing the formation of the photoconductive layer in each first reactor was delayed. This enabled the surface layer of each photosensitive member to be formed in the second reactor without loss of time. According to this Example, the time taken for ten cycles to manufacture forty photosensitive members was 4,320 minutes.

Accordingly, it is unnecessary to install the second reactor in the same number as the first reactors, and the number of the second reactor can be lessened. Hence, the cost of equipment investment can be reduced.

Example 3

In this Example, using the electrophotographic photosensitive member manufacturing apparatus shown in FIG. 4, layers up to photoconductive layers comprised of a-Si:H were formed on four cylindrical substrates 1 of 80 mm in outer diameter, 358 mm in length and 3 mm in wall thickness, made of aluminum, in the first reactor 303 under conditions shown in Table 5.

TABLE 5

| | |
|---|---|
| Lower-part blocking layer: | |
| $SiH_4$ | 400 ml/min (normal) |
| $H_2$ | 800 ml/min (normal) |
| NO | 10 ml/min (normal) |
| $B_2H_6$ | 2,000 ppm (based on $SiH_4$ flow rate) |
| Power | 300 W (80 MHz) |
| Discharge space pressure | 0.8 Pa |
| Substrate temperature | 200° C. |
| Film formation time | 60 min |
| Photoconductive layer: | |
| $SiH_4$ | 500 ml/min (normal) |
| $H_2$ | 500 ml/min (normal) |
| Power | 400 W (80 MHz) |
| Discharge space pressure | 0.8 Pa |
| Substrate temperature | 200° C. |
| Film formation time | 240 min |

Next, the cylindrical substrates 1 on each of which the layers up to the photoconductive layer were formed were transported to the second reactor 304 by means of the vacuum transport container 306, after waiting for 30 minuts until the substrate temperature came to be 150° C., the second-layer surface layers comprised of a-C:H were formed under conditions shown in Table 6. During this process, the interior of the first reactor 303 was cleaned by dry etching under conditions shown in Table 7, which was done simultaneously.

TABLE 6

| Surface layer: | |
|---|---|
| $C_2H_2$ | 120 ml/min (normal) |
| Power | 1,000 W (80 MHz) |
| Discharge space pressure | 0.8 Pa |
| Substrate temperature | 150° C. |
| Film formation time | 5 min |

TABLE 7

| Etching conditions: | |
|---|---|
| $ClF_3$ | 200 ml/min (normal) |
| Ar | 400 ml/min (normal) |
| Power | 1,000 W (80 MHz) |
| Discharge space pressure | 0.8 Pa |
| Substrate temperature | 200° C. |

In this Example, as both the first reactor and the second reactor, the reactor constructed as shown in FIG. 5 was used, and high-frequency power with a frequency of 80 MHz was supplied to each of them. This cycle was repeated by ten cycles to make up forty electrophotographic photosensitive members.

In this Example, substrate-heating time in the first reactor was 30 minutes, and time for dry etching in the first reactor was 120 minutes. Also, the time taken for ten cycles was 4,500 minutes.

Example 4

In this Example, using the electrophotographic photosensitive member manufacturing apparatus shown in FIG. 6, layers up to photoconductive layers comprised of a-Si:H were formed on four cylindrical substrates 1 of 80 mm in outer diameter, 358 mm in length and 3 mm in wall thickness, made of aluminum, in the first reactor 503 constructed as shown in FIG. 5, and under the conditions shown in Table 5. The layers were simultaneously formed on the plurality of substrates.

Next, the cylindrical substrates on each of which the layers up to the photoconductive layer were formed were first transported to the stand-by container 509 by means of the vacuum transport container (not shown). Then, the cylindrical substrates on each of which the layers up to the photoconductive layer were formed were successively transported to the second reactor 504 constructed as shown in FIG. 3, and the surface layer comprised of a-C:H was formed on each photoconductive layer under the conditions shown in Table 2. During this process, the interior of the first reactor 503 was cleaned by dry etching under the conditions shown in Table 7, which was done simultaneously.

In this Example, the reactor constructed as shown in FIG. 5 was used as the first reactor 503, and high-frequency power with a frequency of 80 MHz was supplied thereto from the high-frequency power source. Also, the reactor constructed as shown in FIG. 3 was used as the second reactor 504, and high-frequency power with a frequency of 13.56 MHz was supplied thereto from the high-frequency power source.

In this Example, the time taken to form the surface layer in the second reactor was 15 minutes per one photosensitive member, inclusive of transport time and so forth. Also, substrate-heating time in the first reactor was 30 minutes, and time for dry etching in the first reactor was 120 minutes. Thus, each reactor was operable in wasteless efficiency, and it was able to manufacture a large number of electrophotographic photosensitive members efficiently. This cycle was repeated by ten cycles to make up forty electrophotographic photosensitive members in total. Also, the time taken for ten cycles was 4,500 minutes.

Next, the photosensitive members prepared in Examples 3 and 4 were evaluated in the following way.

b) Image defects:

Evaluation was made on image defects in the same manner as in Example 1.

c) Surface layer thickness unevenness:

The thickness of each surface layer of the electrophotographic photosensitive members thus prepared was measured with a reflection spectral interferometer (MCDP2000, manufactured by Ohtsuka Denshi K. K.). This was measured on five spots in the axial direction of the electrophotographic photosensitive member, and any layer thickness unevenness was examined to make an evaluation. The evaluation was made according to the following criteria.

AA: Scattering in layer thickness is less than 10%.
A: Scattering in layer thickness is 10% or more to less than 15%.
B: Scattering in layer thickness is 15% or more to less than 20%.
C: Scattering in layer thickness is 20% or more.

d) Sensitivity unevenness:

The electrophotographic photosensitive member is electrostatically charged to a certain dark-area surface potential. Then, it is immediately irradiated with halogen lamp light from which the light in the wavelength range of 600 nm or more has been removed with a filter, and the amount of light is so regulated that the light-area surface potential of the electrophotographic photosensitive member comes to be a stated value. The amount of light required in this instance is calculated from the lighting voltage of the halogen lamp light source to regard it as sensitivity. According to this procedure, the sensitivity was measured on five spots in the axial direction of the electrophotographic photosensitive member, and any sensitivity unevenness was examined to make an evaluation. The evaluation was made according to the following criteria.

AA: Scattering in sensitivity is less than 10%.
A: Scattering in sensitivity is 10% or more to less than 15%.
B: Scattering in sensitivity is 15% or more to less than 20%.
C: Scattering in sensitivity is 20% or more.

e) Density unevenness:

The electrophotographic photosensitive member is electrostatically charged to have a stated dark-area surface potential at the development position. Then, it is immediately irradiated with halogen lamp light from which the light in the wavelength range of 600 nm or more has been removed with a filter, and the amount of light required for the surface potential to come to 50 V here is measured. Subsequently, it is electrostatically charged to a stated surface potential like the case of the evaluation on sensitivity unevenness, and irradiated by light in an amount of light of ½ of the above amount of light to perform development with a developing assembly. In this situation, image density was measured with an image densitometer (Macbeth RD914) on five spots in the axial direction of the electrophotographic photosensitive member, and evaluation was made according to the following criteria.

AA: Scattering in density is less than 10%.
A: Scattering in density is 10% or more to less than 15%.
B: Scattering in density is 15% or more to less than 20%.
C: Scattering in density is 20% or more.

The results of evaluation on the foregoing are shown together in Table 8.

TABLE 8

| | Cycle: 1 | 2 | 3 | 4 | 5 | 6 | 7 | 8 | 9 | 10 |
|---|---|---|---|---|---|---|---|---|---|---|
| Example 3 | | | | | | | | | | |
| Image defects: | AA | AA | AA | AA | AA | AA | AA | AA | AA | AA |
| Layer thickness unevenness: | A | A | A | A | A | A | A | A | A | A |
| Sensitivity unevenness: | A | A | A | A | A | A | A | A | A | A |
| Density unevenness: | A | A | A | A | A | A | A | A | A | A |
| Example 4 | | | | | | | | | | |
| Image defects: | AA | AA | AA | AA | AA | AA | AA | AA | AA | AA |
| Layer thickness unevenness: | AA | AA | AA | AA | AA | AA | AA | AA | AA | AA |
| Sensitivity unevenness: | AA | AA | AA | AA | AA | AA | AA | AA | AA | AA |
| Density unevenness: | AA | AA | AA | AA | AA | AA | AA | AA | AA | AA |

As shown in Table 8, in respect of image defects, good results were obtained in the both Examples 3 and 4.

Good results were also obtained in respect of the surface layer thickness unevenness, the sensitivity unevenness and the density unevenness, and better results were obtained in the photosensitive members prepared in Example 4. This was because the surface layer was formed in the second reactor made optimum for the formation of a-C:H layer.

Example 5

Using the electrophotographic photosensitive member manufacturing apparatus shown in FIG. 2, layers up to a photoconductive layer (a-Si:H) were formed on a cylindrical substrate 1 of 108 mm in outer diameter, 358 mm in length and 3 mm in wall thickness, made of aluminum, in the first reactor 103 in the same manner as in Example 1 under the conditions shown in Table 1, and an intermediate layer was further continuously formed thereon under conditions shown in Table 9.

TABLE 9

| Intermediate layer: | |
|---|---|
| $C_2H_2$ | 50 ml/min (normal) |
| $SiH_4$ | 300 ml/min (normal) |
| Power | 200 W (13.56 MHz) |
| Discharge space pressure | 73 Pa |
| Substrate temperature | 200° C. |
| Film formation time | 3 min |

Next, the cylindrical substrate on which the layers up to the intermediate layer were formed was transported to the second reactor 104 by means of the vacuum transport container 106. After standing-by for 30 minutes until the substrate temperature came to be 150° C., the a-C:H surface layer was formed under the conditions shown in Table 2. During this process, the interior of the first reactor 103 was cleaned by dry etching under the conditions shown in Table 3, which was done simultaneously.

This cycle was repeated by ten cycles to make up ten electrophotographic photosensitive members.

In this Example, time for dry etching in the first reactor was 120 minutes. Also, the time taken for ten cycles was 4,260 minutes.

Example 6

Using the electrophotographic photosensitive member manufacturing apparatus shown in FIG. 2, layers up to a photoconductive layer (a-Si:H) were formed on a cylindrical substrate 1 of 108 mm in outer diameter, 358 mm in length and 3 mm in wall thickness, made of aluminum, in the first reactor 103 in the same manner as in Example 1 under the conditions shown in Table 1.

Next, the cylindrical substrate on which the layers up to the photoconductive layer were formed was transported to the second reactor 104 by means of the vacuum transport container 106. After standing-by for 30 minutes until the substrate temperature came to be 150° C., an intermediate layer was formed thereon under conditions shown in Table 10. Then, the a-C:H surface layer was formed under the conditions shown in Table 2. During this process, the interior of the first reactor 103 was cleaned by dry etching under the conditions shown in Table 3, which was done simultaneously.

This cycle was repeated by ten cycles to make up ten electrophotographic photosensitive members.

TABLE 10

| Intermediate layer: | |
|---|---|
| $C_2H_2$ | 50 ml/min (normal) |
| $SiH_4$ | 300 ml/min (normal) |
| Power | 200 W (13.56 MHz) |
| Discharge space pressure | 73 Pa |
| Substrate temperature | 150° C. |
| Film formation time | 3 min |

In this Example, time for dry etching in the first reactor was 120 minutes. Also, the time taken for ten cycles was 4,230 minutes.

The photosensitive members thus prepared were set in the above electrophotographic apparatus to evaluate electrophotographic performance on those obtained through one cycle to ten cycles in the following way.

f) Sensitivity:

The electrophotographic photosensitive member is electrostatically charged to a certain dark-area surface potential.

Then, it is immediately irradiated with halogen lamp light from which the light in the wavelength range of 600 nm or more has been removed with a filter, and the amount of light is so regulated that the light-area surface potential of the electrophotographic photosensitive member comes to be a stated value. The amount of light required in this instance is calculated from the lighting voltage of the halogen lamp light source to regard it as sensitivity. According to this procedure, the sensitivity was measured on five spots in the axial direction of the electrophotographic photosensitive member, and its average value of the ten photosensitive members at each spot was compared between Examples 5 and 6.

There was no difference in average value at each point, and also the scattering in numerical values was within 1%.

g) Charging performance:

The value of electric current flowing when the electrophotographic photosensitive member was electrostatically charged to a certain dark-area surface potential. In the same manner as in the above evaluation of sensitivity, the sensitivity was measured on five spots in the axial direction of the electrophotographic photosensitive member, and its average value of the ten photosensitive members at each spot was compared between Examples 5 and 6.

There was no difference in average value at each point, and also the scattering in numerical values was within 1%.

The adherence of deposited layers of the electrophotographic photosensitive member prepared was further evaluated in the following way.

h) Evaluation of adherence:

Heat shock test:

The electrophotographic photosensitive members prepared were left for 12 hours in a container controlled to a temperature of −20° C., and immediately thereafter left for 1 hour in a container controlled to a temperature of 70° C. and a humidity of 80%. This cycle was repeated by five cycles, and thereafter the surfaces of the electrophotographic photosensitive members were visually observed to make evaluation according to the following criteria.

AA: Very good.
A: Good.
B: Fine film peeling is partly seen.
C: Relatively great film peeling is partly seen.

Observation of end peeling:

End regions (50 mm each from the top and bottom ends) of the electrophotographic photosensitive members prepared were observed with a magnifier to make an evaluation according to the following criteria.

AA: Very good.
A: Good.
B: Fine end peeling is partly seen.
C: Relatively great end peeling is partly seen.

The results of evaluation on the adherence are shown in Table 11.

TABLE 11

| Heat shock test | End peeling |
|---|---|
| Example 5: AA | AA |
| Example 6: AA | AA |

As shown in Table 11, good results were obtained in the both Examples 5 and 6.

It was found from the foregoing results that the photosensitive members prepared in Examples 5 and 6 had equally good electrophotographic performance and equally good photosensitive members were prepared. Good results were also obtained in respect of the adherence of deposited films for each member.

More specifically, the adherence is more improved when the intermediate layer is provided. Also, equal photosensitive members are obtained no matter which reactor is used to form the intermediate layer therein.

In addition, where any trouble or maintenance service of the manufacturing apparatus has caused a discrepancy in the manufacturing cycle, the intermediate layer may be formed in either reactor, and hence the manufacturing apparatus can be operated in a good efficiency.

Example 7

Figure 9:
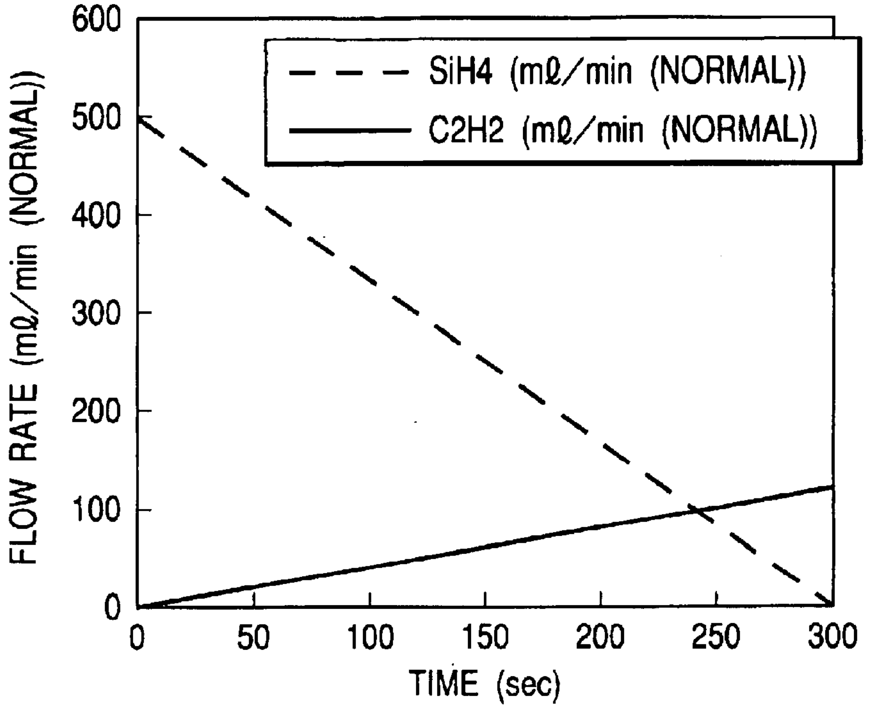
FIG. 9 is a graph showing patterns of changes in flow rate when intermediate layers are formed.

In this Example, using the electrophotographic photosensitive member manufacturing apparatus shown in FIG. 6, layers up to photoconductive layers were formed on four cylindrical substrates 1 of 80 mm in outer diameter, 358 mm in length and 3 mm in wall thickness, made of aluminum, in the first reactor 503 constructed as shown in FIG. 5, and under the conditions shown in Table 5. The layers were simultaneously formed on the plurality of substrates, and intermediate layers were further continuously formed thereon under conditions shown in Table 12 and according to flow rate change patterns shown in FIG. 9.

TABLE 12

| Intermediate layer: | |
|---|---|
| $C_2H_2$ | 0 → 120 ml/min (normal) (flow rate changed) |
| $SiH_4$ | 500 ml/min (normal) → 0 (flow rate changed) |
| Power | 400 W (80 MHz) |
| Discharge space pressure | 0.8 Pa |
| Substrate temperature | 200° C. |
| Film formation time | 5 minutes |

Next, the cylindrical substrates on each of which the layers up to the intermediate layer were formed were first transported to the stand-by container 509 by means of the vacuum transport container (not shown). Then, after standing-by for 90 minutes until the substrate came to be room temperature, the cylindrical substrates on each of which the layers up to the intermediate layer were formed were successively transported to the second reactor 504 constructed as shown in FIG. 3, and the surface layer comprised of a-C:H was formed on each photoconductive layer under the conditions shown in Table 13. During this process, the interior of the first reactor 503 was cleaned by dry etching under the conditions shown in Table 7, which was done simultaneously.

TABLE 13

| Surface layer: | |
|---|---|
| $C_2H_2$ | 120 ml/min (normal) |
| Power | 1,000 W (13.56 MHz) |
| Discharge space pressure | 73 Pa |
| Substrate temperature | room temperature |
| Film formation time | 3 min |

In this Example, the substrate-heating time in the first reactor was 30 minutes, and time for dry etching in the first reactor was 120 minutes. Thus, each reactor was operable in wasteless efficiency, and it was able to manufacture a large number of electrophotographic photosensitive members efficiently. This cycle was repeated by ten cycles to make up forty electrophotographic photosensitive members in total. Also, the time taken for ten cycles was 4,550 minutes.

Example 8

In this Example, too, using the electrophotographic photosensitive member manufacturing apparatus shown in FIG. 6, layers up to photoconductive layers comprised of a-Si:H were formed in the same manner as in Example 7 under the conditions shown in Table 5.

Figure 10:
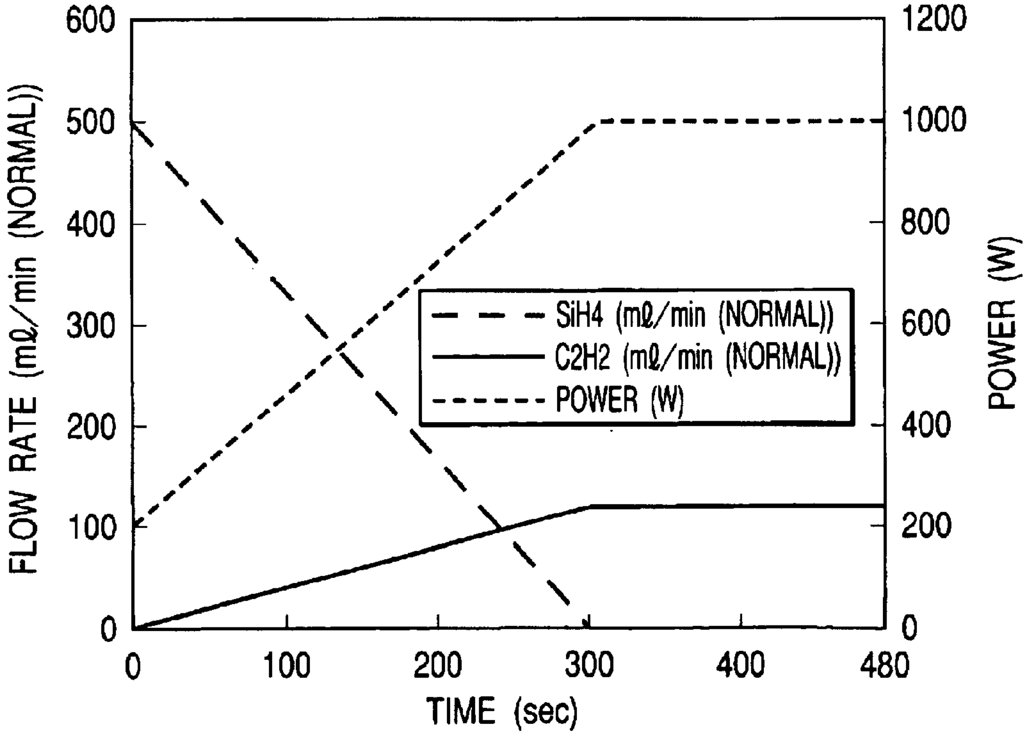
FIG. 10 is a graph showing patterns of changes in flow rate and power when intermediate layers and surface layers are formed.

Next, the cylindrical substrates on each of which the layers up to the photoconductive layer were formed were first transported to the stand-by container 509 by means of the vacuum transport container (not shown) Then, after standing-by for 90 minutes until the substrate came to be room temperature, the cylindrical substrates on each of which the layers up to the photoconductive layer were formed were successively transported to the second reactor 504 constructed as shown in FIG. 3, and an intermediate layer and a surface layer were further continuously formed thereon under conditions shown in Table 14 and according to flow rate and power change patterns shown in FIG. 10.

During the above process, the interior of the first reactor 503 was cleaned by dry etching under the conditions shown in Table 7, which was done simultaneously.

TABLE 14

| | |
|---|---|
| Intermediate layer: | |
| $C_2H_2$ | 0→120 ml/min (normal) (flow rate changed) |
| $SiH_4$ | 500 ml/min (normal) → 0 (flow rate changed) |
| Power | 200 W → 1,000 W (13.56 MHz) (power changed) |
| Discharge space pressure | 73 Pa |
| Substrate temperature | room temperature |
| Film formation time | 5 min |
| Surface layer: | |
| $C_2H_2$ | 120 ml/min (normal) |
| Power | 1,000 W (13.56 MHz) |
| Discharge space pressure | 73 Pa |
| Substrate temperature | room temperature |
| Film formation time | 3 min. |

In this Example, the time taken to form the intermediate layer and surface layer in the second reactor was 20 minutes per one photosensitive member, inclusive of transport time and so forth. Also, the substrate-heating time in the first reactor was 30 minutes, and time for dry etching in the first reactor was 120 minutes. Thus, each reactor was operable in wasteless efficiency, and it was able to manufacture a large number of electrophotographic photosensitive members efficiently. This cycle was repeated by ten cycles to make up forty electrophotographic photosensitive members in total. Also, the time taken for ten cycles was 4,500 minutes.

The photosensitive members prepared in Examples 7 and 8 were each set in a remodeled machine iR6000, manufactured by CANON INC., to evaluate electrophotographic performance in the following way.

Evaluation on melt adhesion:

The photosensitive members obtained were each mounted to the remodeled machine iR6000, manufactured by CANON INC., and the surface temperature of the photosensitive member was so controlled as to come to be 50° C. by a photosensitive-member heating means. Setting its processing speed at 400 mm/sec, A4-size paper 100,000-sheet continuous-feed running was tested under environmental conditions of 25° C. and 10% in relative humidity to make an evaluation on melt adhesion. Here, as an original, a single-line chart in which a single 1 mm wide black line was printed in a shoulder sash on a white background was used so as to provide a severe environment for the cleaning conditions.

After the running test was finished, a whole-area halftone image and a whole-area white image were reproduced to observe any black spots (dots) caused by the melt adhesion of developer.

Results obtained were evaluated according to the following criteria.

AA: No melt adhesion is seen on both the images and the photosensitive member surface over the whole areas; very good.
A: Slight melt adhesion occurs on the photosensitive member surface, but does not appear on the images; good.
B: Melt adhesion slightly appearing on the images occurs, and appears and disappears repeatedly, but there is no problem in practical use.
C: Melt adhesion appearing on the images occurs and increases on and on, and there is a problem in practical use.

Evaluation on filming:

On the photosensitive member on which A4-size paper 100,000-sheet running was tested under the above conditions, the layer thickness of its surface layer was measured with a reflection spectral interferometer (MCDP2000). Next, alumina powder with a particle diameter of 100 μm was applied to a wet soft cloth, and the photosensitive member surface was gently rubbed with it 10 times. As the extent of force for this rubbing, a virgin photosensitive member was previously rubbed to make sure that the surface layer did not abrade, and the surface was rubbed at such a force.

Thereafter, the layer thickness of the surface layer was again measured with the reflection spectral interferometer, and its difference was defined to be the filming level.

Results obtained were evaluated according to the following criteria.

AA: No filming occurs at all; very good.
A: It occurs at a filming level of 50 angstroms or less; good.
B: It occurs at a filming level of 100 angstroms or less, and there is no problem in practical use.
C: It occurs at a filming level of more than 100 angstroms, and there is a possibility of causing, e.g., faulty cleaning.

Observation of adherence and end peeling:

Using the photosensitive members on which the running test was finished, the adherence and end peeling of deposited films were observed by the same test method as that used in Examples 5 and 6.

The results of the foregoing are shown together in Table 15.

TABLE 15

| | Melt adhesion | Filming | Heat shock | End peeling |
|---|---|---|---|---|
| Example 7: | A | A | AA | AA |
| Example 8: | AA | AA | AA | AA |

As shown in Table 15, good results were obtained in the both Examples 7 and 8.

In this Example, since the surface layer and intermediate layer formed in the second reactor were formed at room temperature, properties against melt adhesion and filming were more improved. It was further ascertained that, since the intermediate layer was formed with a stepwise compositional change, good image characteristics were obtained also in digital copying machines.

It was found from the foregoing results that the photosensitive members prepared in Examples 7 and 8 were good photosensitive members having good electrophotographic performance. Also, the formation of the intermediate layer with a stepwise compositional change also brought about more improvement in the adherence of deposited films.

Good photosensitive members are also obtained no matter which reactor is used to form the intermediate layer therein.

Example 9

In this Example, using the electrophotographic photosensitive member manufacturing apparatus shown in FIG. 2, layers up to a photoconductive layer were formed on a cylindrical substrate 1 of 108 mm in outer diameter, 358 mm in length and 3 mm in wall thickness, made of aluminum, in the first reactor 103 under the conditions shown in Table 1.

Next, the cylindrical substrate on which the layers up to the photoconductive layer were formed was transported to the second reactor 104 by means of the vacuum transport container 106. After waiting for 90 minutes until the substrate temperature came to be room temperature, the surface layer comprised of a-C:H was formed under conditions shown in Table 16. In this Example, silicon atoms was incorporated in the a-C:H silicon atoms in a trace quantity.

TABLE 16

| Surface layer: | |
|---|---|
| $C_2H_2$ | 120 ml/min (normal) |
| $SiH_4$ | (flow rate changed)* |
| Power | 1,200 W (13.56 MHz) |
| Discharge space pressure | 73 Pa |
| Substrate temperature | room temperature |
| Film formation time | 3 min |

*The flow rate was changed as shown in Table 17 correspondingly to Drums A to G.

During the above process, the interior of the first reactor 103 was cleaned by dry etching under the conditions shown in Table 3, which was done simultaneously.

This cycle was repeated by ten cycles to make up ten electrophotographic photosensitive members (for each of Drums A to G). Also, in this Example, the substrate-heating time in the first reactor was 30 minutes, and time for dry etching in the first reactor was 120 minutes. Also, the time taken for ten cycles was 4,230 minutes.

Comparative Example 2

To compare the manufacturing process of Example 9 described above, using the electrophotographic photosensitive member manufacturing apparatus shown in FIG. 8, layers up to a photoconductive layer were formed on a cylindrical substrate 1 of 108 mm in outer diameter, 358 mm in length and 3 mm in wall thickness, made of aluminum, in the reactor 803 in the same manner as in Comparative Example 1 under the conditions shown in Table 1, and subsequently the surface layer comprised of a-C:H was formed under the conditions shown in Table 16. In this film formation, too, like Example 9, after waiting for 90 minutes in order to lower the substrate temperature to room temperature, the surface layer comprised of a-C:H was formed in which silicon atoms were incorporated in a trace quantity, changing the flow rate of $SiH_4$ as shown in Table 17 correspondingly to Drums H to N.

After an electrophotographic photosensitive member was prepared according to such a procedure and the electrophotographic photosensitive member was unloaded, the interior of the reactor 803 was cleaned by dry etching under the conditions shown in Table 3. This cycle was repeated by ten cycles to make up ten electrophotographic photosensitive members (for each of Drums H to N).

In Comparative Example 2, time for dry etching of the interior of the first reactor was 180 minutes. Also, the time taken for ten cycles was 5,760 minutes.

The photosensitive member thus prepared were evaluated in the same manner as in Examples 7 and 8. Also, any damage of cleaning blade edges was examined in the following way.

Damage of cleaning blade edge:

After the 100,000-sheet running test under the above conditions was completed, whether or not the cleaning blade edge was damaged was observed with an optical microscope and evaluation was made according to the following criteria.

AA: The blade looks as good as new; very good.

A: The blade has worn a little at its edge, but any break is seen; good.

B: The blade has broken a little at its edge, but on a level of no difficulty for cleaning.

C: The blade has fairly broken at its edge, and there is a possibility of causing, e.g., faulty cleaning.

After the evaluation, a part of each photosensitive member was cut out, and the composition of the surface layer was measured with an instrument (SSX-100, manufactured by SSI Co.) making use of X-ray photoelectron spectroscopy.

Results obtained are shown in Table 17.

TABLE 17

| | Example 9 | | | | | | |
|---|---|---|---|---|---|---|---|
| Drum: | A | B | C | D | E | F | G |
| $SiH_4$ flow rate: (ml/min (normal)) | 0.5 | 1 | 2 | 6 | 12 | 20 | 25 |
| Silicon content in surface layer: (%) | 0.05 | 0.4 | 0.8 | 4.0 | 9.8 | 12.5 | 19.5 |
| Evaluation | | | | | | | |
| Melt adhesion: | AA | AA | AA | AA | A | A | B |
| Filming: | AA | AA | AA | AA | A | A | B |
| Blade damage: | AA | AA | AA | AA | AA | A | B |
| Adherence: | A | A | A | A | A | A | A |
| Reactor utilization: | AA | AA | AA | AA | AA | AA | AA |
| Overall | AA | AA | AA | AA | AA | A | A |

TABLE 17-continued evaluation:

| | Comparative Example 2 | | | | | | |
|---|---|---|---|---|---|---|---|
| Drum: | H | I | J | K | L | M | N |
| $SiH_4$ flow rate: (ml/min (narmal)) | 0.5 | 1 | 2 | 6 | 12 | 20 | 25 |
| Silicon content in surface layer: (%) | 0.05 | 0.4 | 0.8 | 4.0 | 9.8 | 12.5 | 19.5 |
| Evaluation | | | | | | | |
| Melt adhesion: | AA | AA | AA | AA | A | A | B |
| Filming: | AA | AA | AA | AA | A | A | B |
| Blade damage: | AA | AA | AA | AA | AA | A | B |
| Adherence: | A | A | A | A | A | A | A |
| Reactor utilization: | B | B | B | B | B | B | B |
| Overall evaluation: | B | B | B | B | B | B | B |

As can be seen from Table 17, it was found that good results are obtainable also when about 10% of silicon atoms are incorporated in the a-C:H surface layer.

The photosensitive members prepared in Example 9 and Comparative Example 2 were each set in an electrophotographic apparatus (a remodeled machine iR6000, manufactured by CANON INC.) to make an evaluation on image defects in the same manner as in Example 1 to obtain the results shown in Table 18.

TABLE 18

| | Cycle: | | | | | | | | | |
|---|---|---|---|---|---|---|---|---|---|---|
| | 1 | 2 | 3 | 4 | 5 | 6 | 7 | 8 | 9 | 10 |
| Example 9: | AA | AA | AA | AA | AA | AA | AA | AA | AA | AA |
| Comparative Example 2: | AA | AA | AA | AA | A | A | A | A | B | B |

Time taken for ten cycles:

Example 9 . . . 4,230 minutes

Comparative Example 2 . . . 5,760 minutes

As shown in Table 18, even when those obtained after repeated cycles were used, the photosensitive members prepared in Example 9 caused less image defects than that of Comparative Example 2 and showed good results. Also, in Example 9 the etching time was made shorter than that in Comparative Example 2, and the time for manufacturing cycles was greatly shortened to bring about an improvement in manufacturing efficiency.

Example 10

In this Example, using the electrophotographic photosensitive member manufacturing apparatus shown in FIG. 2, layers up to a photoconductive layer were formed in the same manner as in Example 1 but under conditions shown in Table 19.

TABLE 19

| | |
|---|---|
| Lower-part blocking layer: | |
| $SiH_4$ | 300 ml/min (narmal) |
| $H_2$ | 600 ml/min (narmal) |
| $PH_3$ | 1,000 ppm (based on $SiH_4$ flow rate) |

TABLE 19-continued

| | |
|---|---|
| Power | 200 W (13.56 MHz) |
| Discharge space pressure | 80 Pa |
| Substrate temperature | 200° C. |
| Film formation time | 60 min |
| Photoconductive layer: | |
| $SiH_4$ | 450 ml/min (narmal) |
| $H_2$ | 450 ml/min (normal) |
| Power | 300 W (13.56 MHz) |
| Discharge space pressure | 66.5 Pa |
| Substrate temperature | 200° C. |
| Film formation time | 240 min |

Next, the cylindrical substrate on which the layers up to the photoconductive layer were formed was transported to the second reactor 104 by means of the vacuum transport container 106. After standing-by for 30 minutes until the substrate temperature lowered from 200° C. to 150° C., the surface layer comprised of a-C:H was formed under the conditions shown in Table 2. During this process, the interior of the first reactor 103 was cleaned by dry etching under the conditions shown in Table 3, which was done simultaneously. The time taken for the cleaning was 120 minutes.

The photosensitive member prepared in Example 10 was set in a copying machine remodeled to have a reverse charge polarity, to make an evaluation in the same manner as in Example 1.

In this Example, the same good results as those in Example 1 were obtained even when the copying machine was made to have a reverse charge polarity.

The present invention constructed as described above brings about the following advantages.

In the process and apparatus for manufacturing the electrophotographic photosensitive member having the surface layer comprised of a-C:H or a-C:H to which a slight amount of silicon (Si) has been added, the first layer comprised of an amorphous material composed chiefly of silicon atoms is formed in the first reactor and the second layer comprised of an amorphous material composed chiefly of carbon atoms and containing hydrogen atoms is formed in the second reactor, so that the manufacturing efficiency can greatly be improved and good-quality and inexpensive electrophotographic photosensitive members can be manufactured.

Stated specifically, the time to clean the interior of the first reactor by dry etching can be shortened, and besides, image defects due to electrophotographic photosensitive members can greatly be reduced. Also, the construction of the second reactor can be designed at will, and better-quality surface layers can uniformly be formed. Hence, electrophotographic photosensitive members superior in durability and stability can be obtained.

What is claimed is:

1. A process for producing an electrophotographic photosensitive member having at least a first layer, a second layer and a conductive substrate, comprising the steps of forming said first layer in a first reactor having been evacuated, transporting said substrate having said first layer, and forming said second layer in a second reactor having been evacuated, wherein a source gas is decomposed by the use of a high-frequency power in each of said first reactor and said second reactor to deposit said first layer and said second layer on said conductive substrate, said first layer comprises an amorphous material composed chiefly of silicon atoms; and said second layer comprises an amorphous material composed chiefly of carbon atoms and hydrogen atoms.

2. The process according to claim 1, wherein the formation of said first layer is the formation of a photoconductive layer.

3. The process according to claim 1, wherein the formation of said second layer is the formation of a surface layer.

4. The process according to claim 1, wherein the formation of said second layer is the formation of a layer which contains silicon atoms and in which a ratio of silicon atoms to the sum of silicon atoms and carbon atoms is $0.2\% \leqq \{Si/(Si+C)\} \times 100 < 10\%$.

5. The process according to claim 4, wherein the ratio of silicon atoms to the sum of silicon atoms and carbon atoms is $0.2\% \leqq \{Si/(Si+C)\} \times 100 < 5\%$.

6. The process according to claim 1, wherein the formation of said first layer comprises the formation of an intermediate layer.

7. The process according to claim 1, wherein the formation of said second layer comprises the formation of an intermediate layer.

8. The process according to claim 6 or 7, wherein the formation of said intermediate layer is conducted with stepwise compositional change.

9. The process according to claim 1, wherein a plurality of said first reactors are used, and the number of said second reactors is smaller than the number of said first reactors.

10. The process according to claim 1, wherein said conductive substrate is a cylindrical substrate, and at least one of said first layer and said second layer is simultaneously formed on a plurality of cylindrical substrates.

11. The process according to claim 1, wherein the high-frequency power used in said first reactor has a frequency different from the frequency of the high-frequency power used in said second reactor.

12. The process according to claim 11, wherein said high-frequency power used in said first reactor has a frequency of from 50 MHz to 450 MHz, and said high-frequency power used in said second reactor has a frequency of 13.56 MHz.

13. The process according to claim 1, which further comprises the step of dry-etching the interior of the first reactor after said first layer has been formed therein, and the step of dry etching and the step of forming said second layer in said second reactor are carried out simultaneously.

14. An apparatus for producing an electrophotographic photosensitive member having at least a first layer, a second layer and a conductive substrate, comprising at least a first reactor for forming said first layer, a vacuum transport container for transporting said substrate having said first layer, and a second reactor for forming said second layer, wherein a source gas is decomposed by the use of a high-frequency power in each of said first reactor and said second reactor to deposit said first layer and said second layer on said conductive substrate, said first layer comprises an amorphous material composed chiefly of silicon atoms; and said second layer comprises an amorphous material composed chiefly of carbon atoms and hydrogen atoms.

15. The apparatus according to claim 14, wherein a plurality of said first reactors are provided, and the number of said second reactors is smaller than the number of said first reactors.

16. The apparatus according to claim 14, wherein said first reactor or second reactor has a mechanism for disposing a plurality of cylindrical substrates.

17. The apparatus according to claim 14, which has a first high-frequency power source for supplying high-frequency power to said first reactor and a second high-frequency power source for supplying high-frequency power to said second reactor, and the high-frequency power supplied from said first high-frequency power source has a frequency different from the frequency of the high-frequency power supplied from said second high-frequency power source.

18. The apparatus according to claim 17, wherein said high-frequency power supplied from said first high-frequency power source has a frequency of from 50 MHz to 450 MHz, and said high-frequency power supplied from said second high-frequency power source has a frequency of 13.56 MHz.

19. The apparatus according to claim 14, which further comprises:

a dry-etching gas feed system for feeding into said first reactor a gas for dry etching; and a source gas feed system for feeding into said second reactor a gas for forming said second layer;

said gases being fed simultaneously from the two gas feed systems into said first and second reactors, respectively.

20. An electrophotographic photosensitive member manufactured by the process according to claim 1.

21. An electrophotographic apparatus comprising the electrophotographic photosensitive member according to claim 20.

* * * * *

UNITED STATES PATENT AND TRADEMARK OFFICE

CERTIFICATE OF CORRECTION

PATENT NO. : 6,753,123 B2
DATED : June 22, 2004
INVENTOR(S) : Ryuji Okamura et al.

It is certified that error appears in the above-identified patent and that said Letters Patent is hereby corrected as shown below:

Title page,
Item [57], ABSTRACT,
Line 3, “rector” should read -- reactor --.

Column 1,
Line 45, “ever” should read -- always --.
Line 49, “estimated” should read -- explained --.
Line 64, “solveing” should read -- solving --.

Column 2,
Line 16, “when,” should read -- when --.

Column 3,
Line 31, “fist” should read -- first --.

Column 4,
Line 8, “rector” should read -- reactor --.
Line 18, “have been on” should read -- have made --.
Line 25, “ethcing” should read -- etching --.
Line 61, “very” should read -- much --.

Column 5,
Line 1, “very” should read -- much --.
Line 26, “con-” should be deleted.
Line 27, “taminate” should be deleted.
Line 42, “come” should read -- become --.

Column 6,
Line 28, “fist” should read -- first --.
Line 64, “mean” should read -- means --.

Column 8,
Line 45, “became” should read -- become --.

Column 9,
Line 23, “silicon” should read -- silicon atoms --.

UNITED STATES PATENT AND TRADEMARK OFFICE

CERTIFICATE OF CORRECTION

PATENT NO. : 6,753,123 B2
DATED : June 22, 2004
INVENTOR(S) : Ryuji Okamura et al.

It is certified that error appears in the above-identified patent and that said Letters Patent is hereby corrected as shown below:

Column 10,
Line 38, "discharge space 419" should read -- discharge space 409 --.

Column 11,
Line 18, "improved" should read -- improve --.
Line 56, "unloading container 105" should read -- unloading container 505 --.

Column 12,
Line 30, "first reactors 103" should read -- first reactors 603 --.

Column 16,
Line 50, "30 minuts" should read -- 30 minutes --.

Column 26,
Line 37, "any" should read -- no --.

Column 27,
Lines 63 and 64, "narmal" should read -- normal --.

Column 28,
Line 8, "narmal" should read -- normal --.

Column 30,
Line 2, "dry etching" should read -- dry-etching --.

Signed and Sealed this

Fourteenth Day of December, 2004

JON W. DUDAS
*Director of the United States Patent and Trademark Office*